United States Patent
Yu et al.

(10) Patent No.: US 9,589,915 B2
(45) Date of Patent: Mar. 7, 2017

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Tsung-Yuan Yu, Taipei (TW); Hao-Yi Tsai, Hsinchu (TW); Chao-Wen Shih, Hsinchu County (TW); Wen-Hsin Chan, Hsinchu County (TW); Chen-Chih Hsieh, Miaoli County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/333,709

(22) Filed: Jul. 17, 2014

(65) Prior Publication Data

US 2016/0020181 A1    Jan. 21, 2016

(51) Int. Cl.
*H01L 23/48*     (2006.01)
*H01L 21/60*     (2006.01)
(Continued)

(52) U.S. Cl.
CPC .......... *H01L 23/585* (2013.01); *H01L 21/565* (2013.01); *H01L 23/3114* (2013.01); *H01L 23/3135* (2013.01); *H01L 23/3171* (2013.01); *H01L 23/3192* (2013.01); *H01L 23/525* (2013.01); *H01L 23/5226* (2013.01); *H01L 24/02* (2013.01); *H01L 24/05* (2013.01); *H01L 24/11* (2013.01); *H01L 24/13* (2013.01); *H01L 24/14* (2013.01); *H01L 24/16* (2013.01); *H01L 24/94* (2013.01); *H01L 2224/0239* (2013.01); *H01L 2224/02377* (2013.01); *H01L 2224/0401* (2013.01); *H01L 2224/05548* (2013.01); *H01L 2224/05624* (2013.01);
(Continued)

(58) Field of Classification Search
CPC ............... H01L 23/3114; H01L 21/561; H01L 23/5226; H01L 23/3142
USPC .................... 257/659, 678, 686, 737, E21.5
See application file for complete search history.

(56) References Cited

U.S. PATENT DOCUMENTS

2005/0280120 A1\* 12/2005 Tomita .................. H01L 23/522
                                                                257/620
2006/0079609 A1\* 4/2006 Nishioka .................... C08J 5/18
                                                                523/400
(Continued)

*Primary Examiner* — Kimberly Rizkallah
*Assistant Examiner* — Brian Turner
(74) *Attorney, Agent, or Firm* — Chun-Ming Shih

(57) ABSTRACT

A semiconductor device includes a substrate defined with a seal ring region and a circuit region, the substrate includes a seal ring structure and an integrated circuit structure, the seal ring structure is disposed in the seal ring region and includes a plurality of stacked conductive layers interconnected by a plurality of via layers, the integrated circuit structure is disposed in the circuit region and includes an active or a passive device; a metal pad disposed over the seal ring region and contacted with the seal ring structure; a passivation layer disposed over the substrate and covering the metal pad; a polymeric layer disposed over the passivation layer and the circuit region; and a molding disposed over the passivation layer and the polymeric layer, wherein the seal ring structure is covered by the molding.

20 Claims, 44 Drawing Sheets

(51) Int. Cl.
  *H01L 21/28*   (2006.01)
  *H01L 23/58*   (2006.01)
  *H01L 23/10*   (2006.01)
  *H01L 23/552*  (2006.01)
  *H01L 23/544*  (2006.01)
  *H01L 21/56*   (2006.01)
  *H01L 23/31*   (2006.01)
  *H01L 23/522*  (2006.01)
  *H01L 23/00*   (2006.01)
  *H01L 23/525*  (2006.01)

(52) U.S. Cl.
  CPC .............. *H01L 2224/05647* (2013.01); *H01L 2224/1191* (2013.01); *H01L 2224/131* (2013.01); *H01L 2224/13022* (2013.01); *H01L 2224/13024* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/14131* (2013.01); *H01L 2224/14136* (2013.01); *H01L 2224/16227* (2013.01); *H01L 2224/94* (2013.01); *H01L 2924/14* (2013.01)

(56) References Cited

U.S. PATENT DOCUMENTS

| | | | |
|---|---|---|---|
| 2008/0217761 A1* | 9/2008 | Yang | H01L 24/24 257/700 |
| 2008/0251923 A1* | 10/2008 | Wang | H01L 23/585 257/758 |
| 2013/0034956 A1* | 2/2013 | Lei | H01L 24/11 438/613 |
| 2013/0087914 A1* | 4/2013 | Yang | H01L 23/3114 257/738 |

* cited by examiner

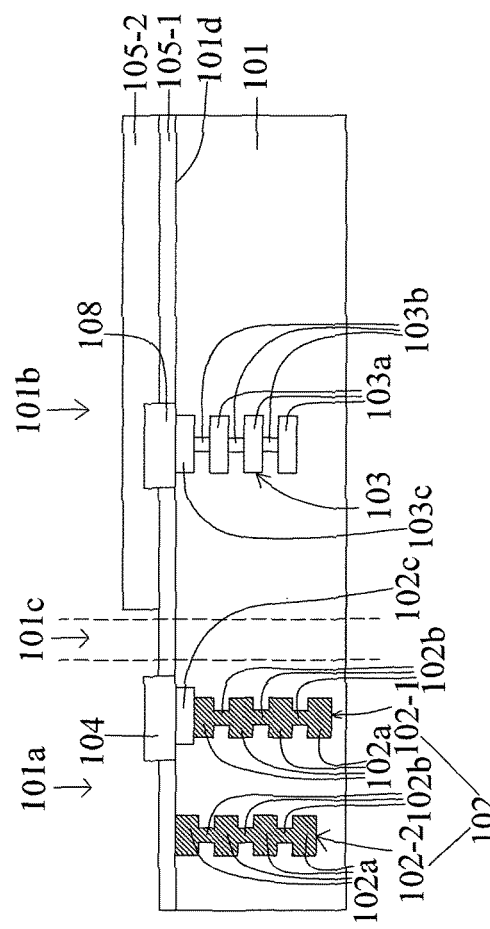
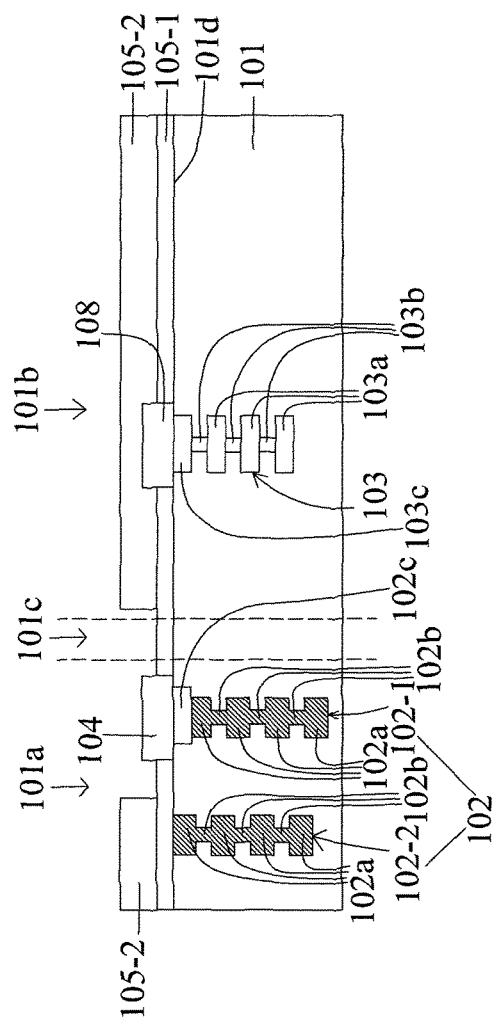
FIG. 31A
FIG. 31B

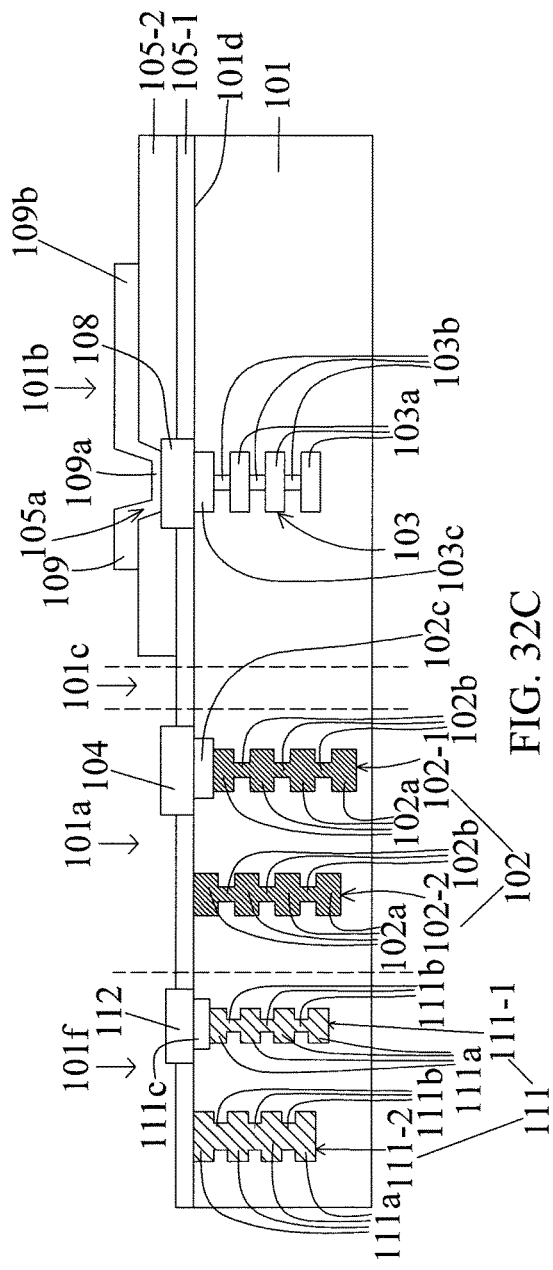
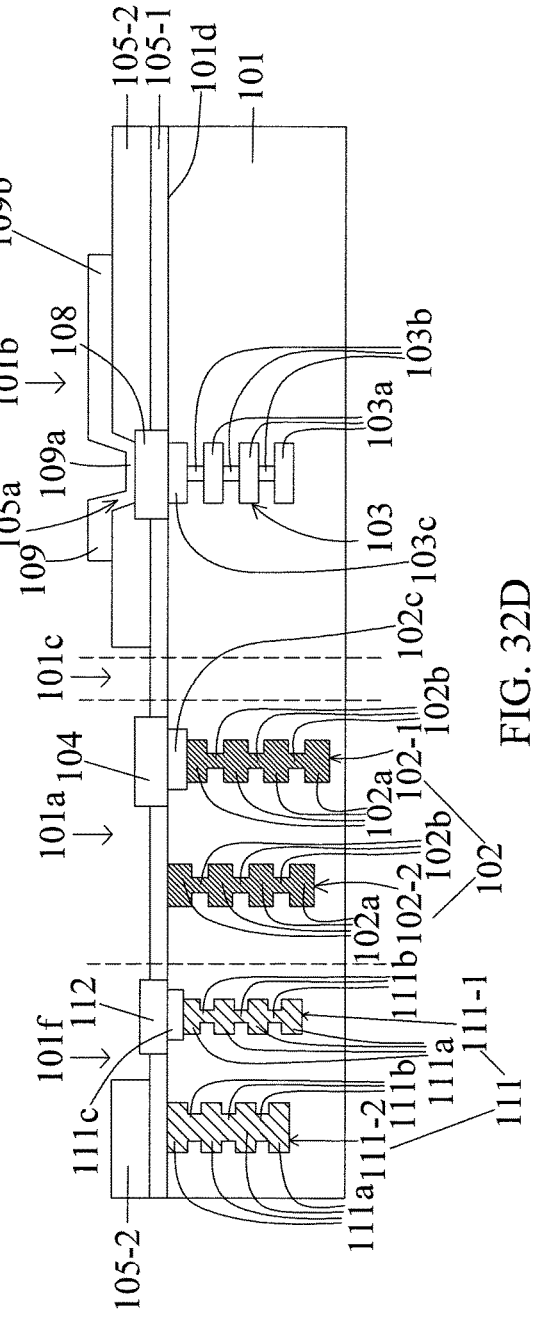
FIG. 32C
FIG. 32D

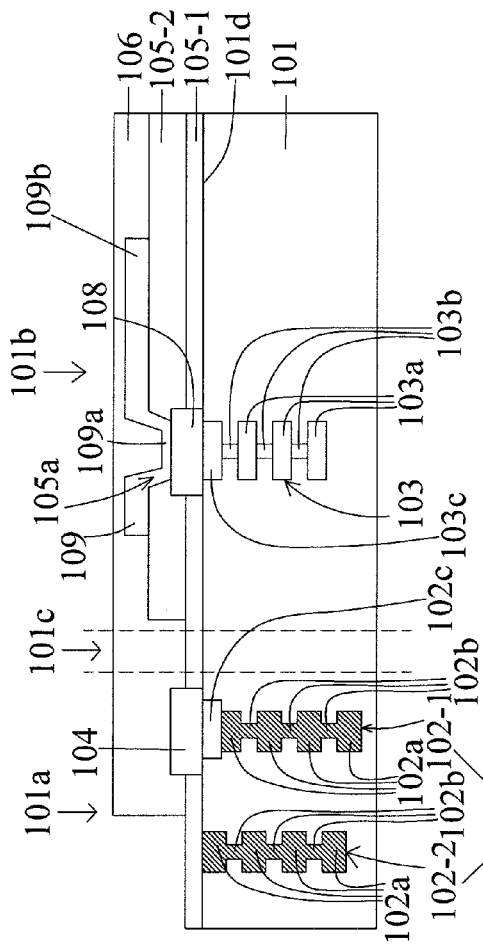
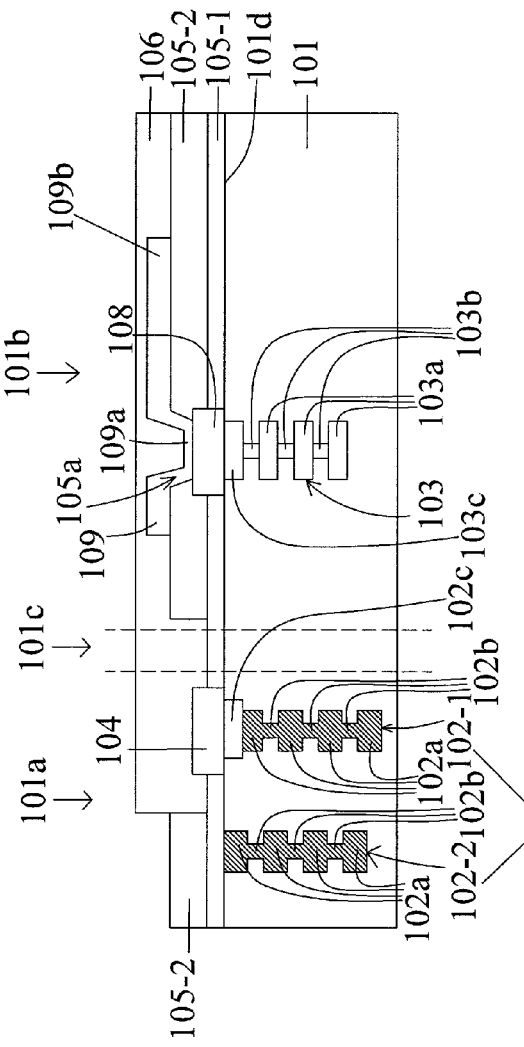
FIG. 33A
FIG. 33B

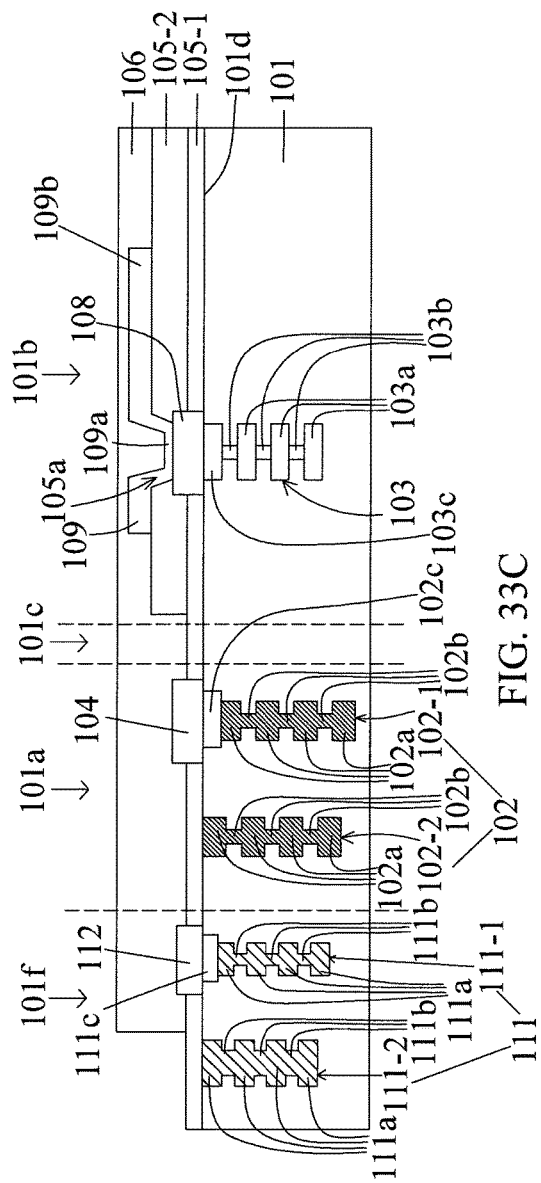
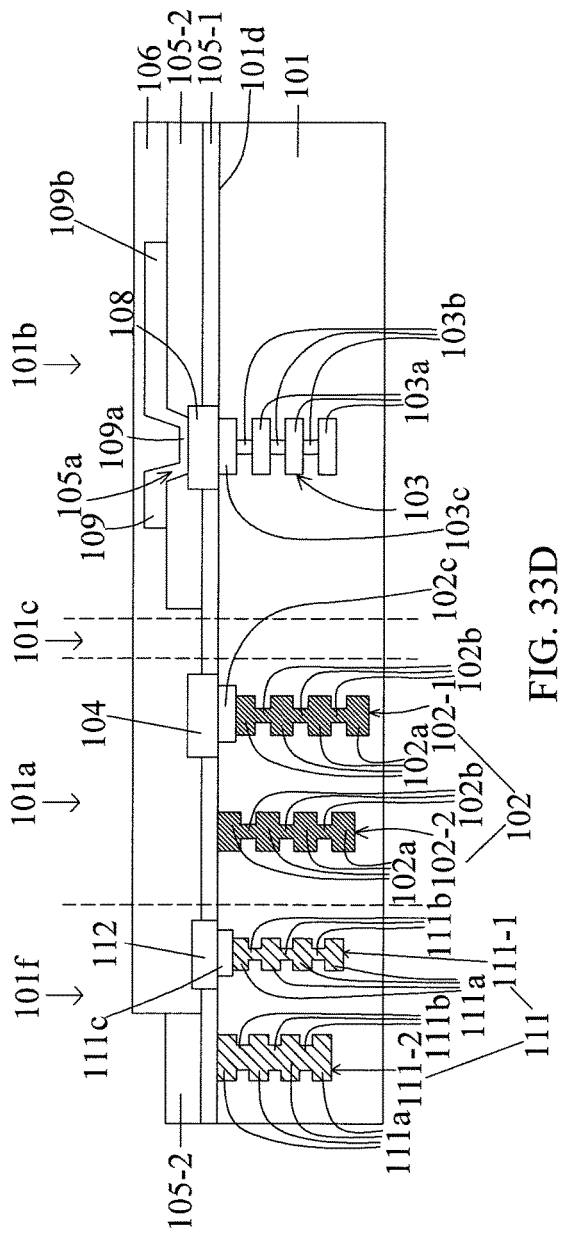
FIG. 33C
FIG. 33D

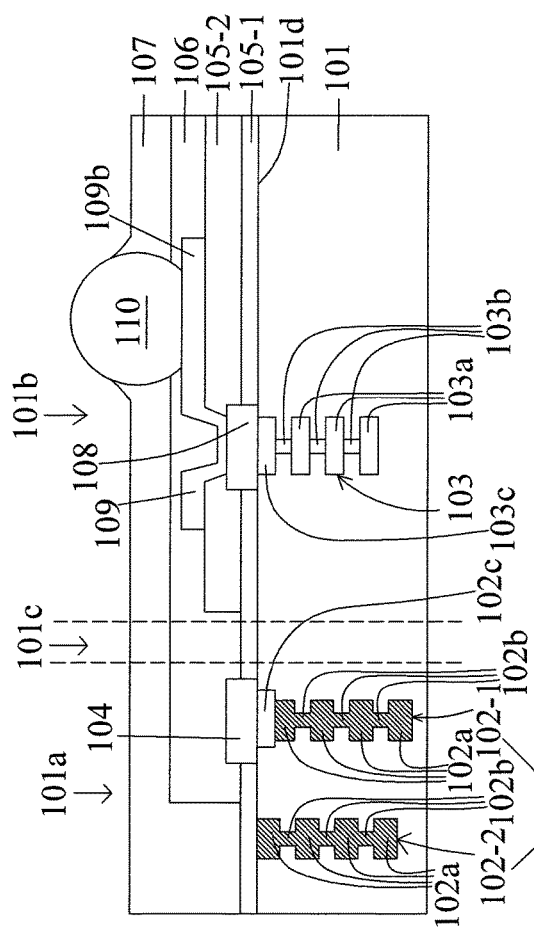
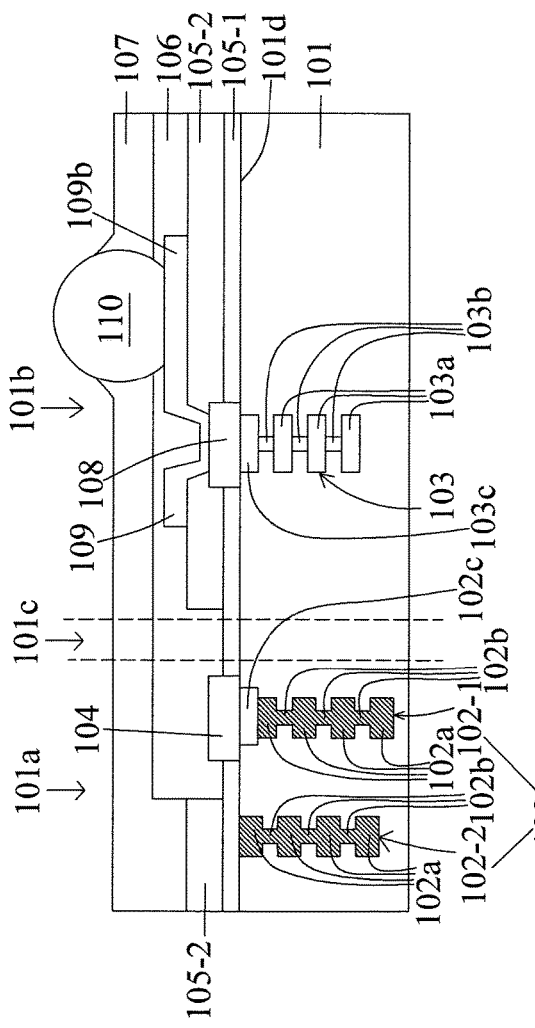
FIG. 35A
FIG. 35B

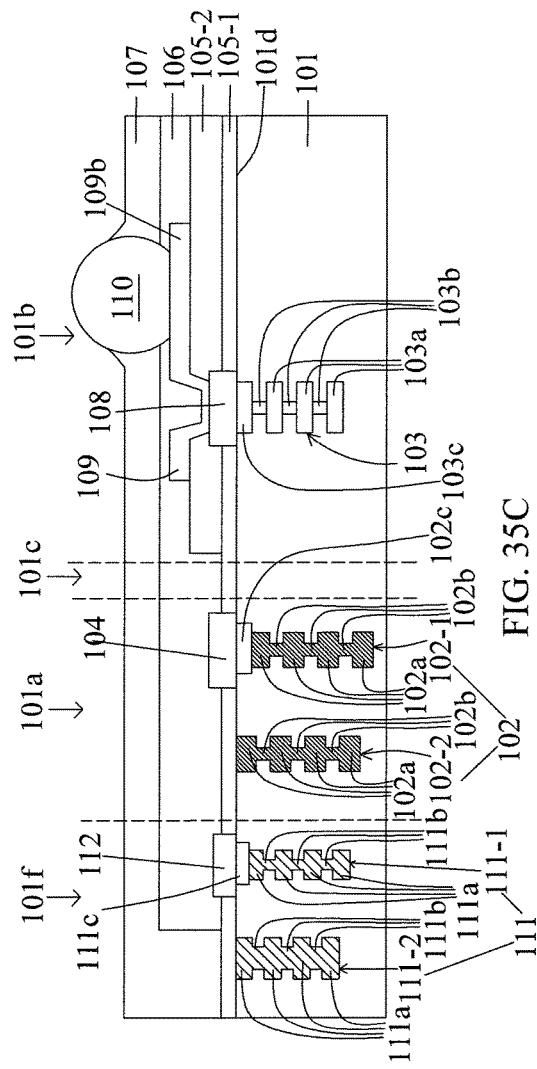
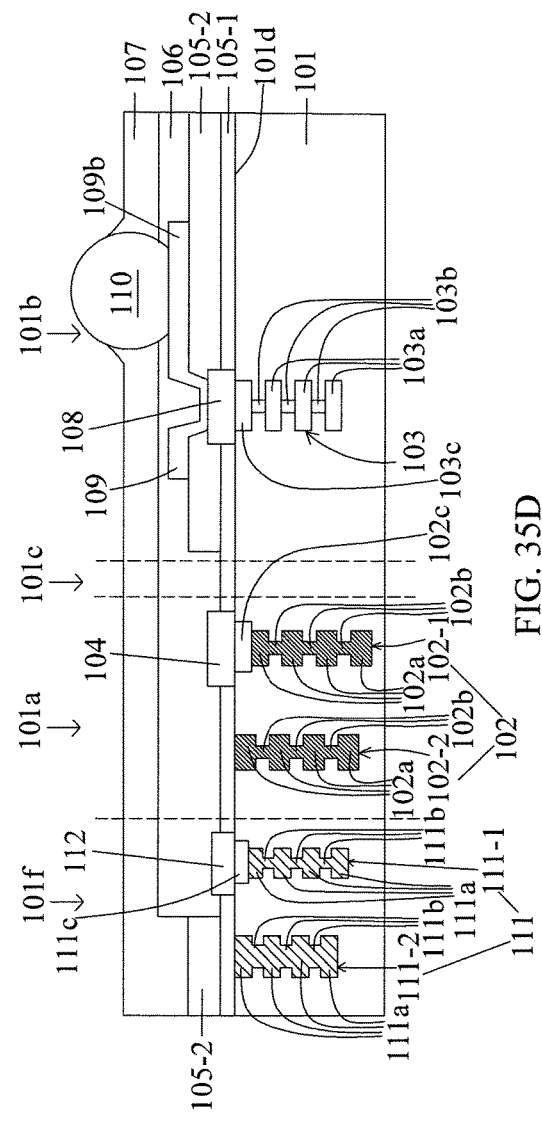
FIG. 35C
FIG. 35D

SEMICONDUCTOR DEVICE AND MANUFACTURING METHOD THEREOF

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level packaging (WLP) is widely used for its low cost and relatively simple manufacturing operations. During the WLP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as contamination, poor electrical interconnection, development of cracks, delamination of the components or high yield loss of the semiconductor device. The semiconductor device is produced in an undesired configuration, which would further exacerbate materials wastage and thus increase the manufacturing cost. As such, there are many challenges for modifying a structure of the semiconductor devices and improving the manufacturing operations.

Since more different components with different materials are involved, a complexity of the manufacturing operations of the semiconductor device is increased. There are more challenges to modify a structure of the semiconductor device and improve the manufacturing operations. As such, there is a continuous need to improve the manufacturing the semiconductor and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 31A-31D are schematic views of a first passivation layer and a second passivation layer disposed over a substrate in accordance with some embodiments of the present disclosure.

FIGS. 32A-32D are schematic views of a post passivation interconnect (PPI) disposed on a second passivation layer in accordance with some embodiments of the present disclosure.

FIGS. 33A-33D are schematic views of a polymeric layer covering a seal ring structure or a dummy bar structure in accordance with some embodiments of the present disclosure.

FIGS. 35A-35D are schematic views of a molding covering a seal ring structure or a dummy bar structure in accordance with some embodiments of the present disclosure.

DETAILED DESCRIPTION OF THE DISCLOSURE

Figure 1:
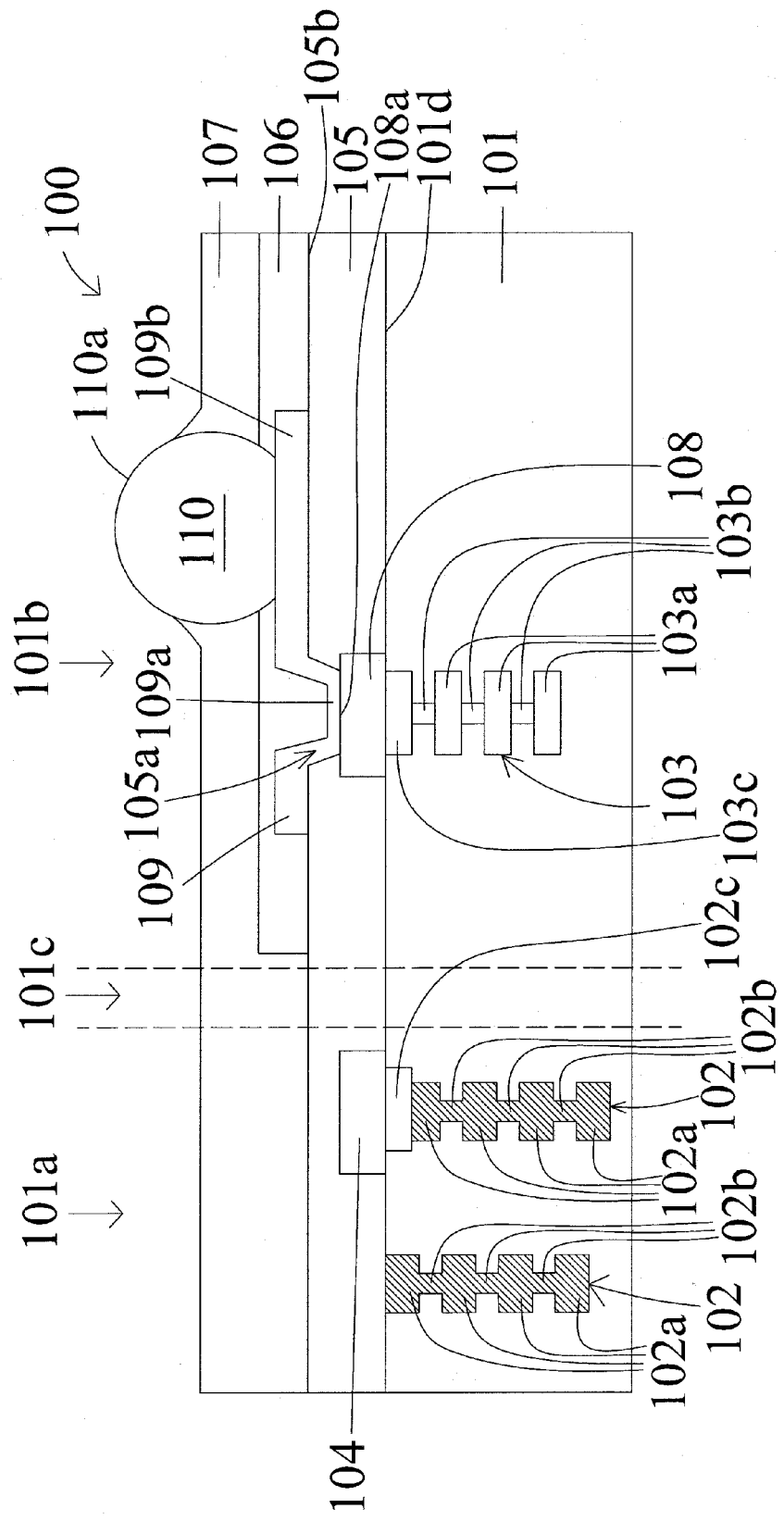
FIG. 1 is a schematic view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices are fabricated from a semiconductor wafer. The semiconductor wafer includes numbers of device areas. Various kinds of components such as conductive traces, polymers, conductive bumps or etc. are disposed over a front side of each device area during fabrication. The semiconductor device is then sawn and singulated from the semiconductor wafer after the fabrication. As the semiconductor devices may be potentially damaged upon the fabrication and singulation, a seal ring is designed and used for protecting the semiconductor device. The seal ring surrounds the components and interconnections disposed on or within the semiconductor device, such that from contamination and damage caused by moisture, chips or other contaminants would be prevented.

However, the existing seal ring is designed for certain kinds of the semiconductor devices in specific structural configuration, such as a semiconductor device which includes an under bump metallurgy (UBM) disposed thereon for receiving a conductive bump. As the conductive bump is seated on the UBM, molding material is not required to apply over the semiconductor device to surround the conductive bump and cover the front side of the semiconductor device. Thus, the molding material would not be disposed over the seal ring. However, the manufacturing cost of the semiconductor devices having the UBM is high, because additional cost on production of photomask is required. Therefore, some modifications and improvements on the semiconductor device are desired in order to manufacture the semiconductor device with the seal ring in a low cost.

FIG. 1 is a semiconductor device 100 in accordance with various embodiments of the present disclosure. FIG. 1 shows a cross sectional view of the semiconductor device 100. In some embodiments, the semiconductor device 100 is a semiconductor die. In some embodiments, the semiconductor device 100 includes a substrate 101, a metal pad 104, a passivation layer 105, a polymeric layer 106 and a molding 107.

In some embodiments, the substrate 101 is a piece including semiconductor materials such as silicon, germanium, gallium arsenic or etc. In some embodiments, the substrate 101 further includes doped regions such as P-well, an N-well, P+ doped active region or etc. In some embodiments, the substrate 101 is fabricated with a predetermined functional circuit over the substrate 101 produced by various methods such as photolithography operations, etching or etc. In some embodiments, active devices (not shown) such as transistors are formed at a surface 101d of the substrate 101. Some interconnect structures (not shown) including metal lines are formed over the substrate 101. In some embodiments, the substrate 101 includes a plurality of dielectric layers for isolating interconnect structures or active devices.

The substrate 101 is defined with a seal ring region 101a and a circuit region 101b. In some embodiments, the seal ring region 101a has a width of about 5 um to about 10 um. In some embodiments, the substrate 101 is further defined with an assembly isolation region 101c between the seal ring region 101a and the circuit region 101b. The seal ring region 101a and the circuit region 101b are separated by the assembly isolation region 101c. In some embodiments, the assembly isolation region 101c is configured to provide physical and electrical isolation between components disposed in the circuit region 101b and components disposed in the seal ring region 101a. In some embodiments, a width of the assembly isolation region 101c is about 5 um to about 10 um.

The substrate 101 further includes a seal ring structure 102 and an integrated circuit structure 103. In some embodiments, the seal ring structure 102 is disposed in the seal ring region 101a. In some embodiments, the seal ring structure 102 is surrounded by the dielectric layers of the substrate 101 including interlayer dielectric (ILD), inter metal dielectric (IMD), extreme low dielectric constant (ELK) dielectric or undoped silicate glass (USG). In some embodiments, the seal ring structure 102 is served as a barrier for preventing contaminants such as moisture, chemicals, corrosive material or etc. from penetrating into the substrate 101 and preventing cracks from propagating into the substrate 101 upon die sawing operations.

In some embodiments, the seal ring structure 102 includes conductive material such as aluminum or copper. In some embodiments, the seal ring structure 102 includes a plurality of stacked conductive layers 102a interconnected by a plurality of via layers 102b. In some embodiments, the stacked conductive layers 102a and the via layers 102b are disposed alternatively.

Each of the stacked conductive layers 102a can be extended along the dielectric layers or along a length of the substrate 101, and the stacked conductive layers 102a are stacked vertically along a thickness of the substrate 101. In some embodiments, the via layers 102b are extended along the thickness of the substrate 101 and passed through the dielectric layers to interconnect the stacked conductive layers 102a. In some embodiments, the seal ring structure 102 further includes a top layer 102c disposed over or on a surface 101d of the substrate 101 and electrically connected with the stacked conductive layers 102a.

In some embodiments, the integrated circuit structure 103 is disposed in the circuit region 101b and includes an active or a passive device such as transistor, capacitor, inductor or etc. In some embodiments, the integrated circuit structure 103 is surrounded by the ILD, IMD or ELK dielectric or undoped silicate glass (USG). In some embodiments, the integrated circuit structure 103 includes a plurality of metal layers 103a for electrically connecting with the active or passive device. In some embodiments, the metal layers 103a are interconnected by a plurality of vias 103b. In some embodiments, the metal layers 103a includes a top metal layer 103c disposed over or on the surface 101d of the substrate 101.

The metal pad 104 is disposed over the seal ring region 101a and is contacted with the seal ring structure 102. In some embodiments, the metal pad 104 is disposed on the substrate 101 and electrically connected with the seal ring structure 102. In some embodiments, the metal pad 104 is coupled with the top layer 102c of the seal ring structure 102. The top layer 102c is disposed underneath the metal pad 104. In some embodiments, the metal pad 104 includes aluminum, copper or other conductive materials. In some embodiments, the metal pad 104 has a length of about 1 um to about 5 um.

A die pad 108 is disposed over the circuit region 101b and is contacted with the integrated circuit structure 103. In some embodiments, the die pad 108 is disposed on the substrate 101 and electrically connected with the integrated circuit structure 103. In some embodiments, the die pad 108 is coupled with the top metal layer 103c of the integrated circuit structure 103. In some embodiments, the die pad 108 includes aluminum (Al), copper (Cu), tin (Sn), nickel (Ni), gold (Au), silver (Ag), other electrically conductive materials, alloy thereof or multi layers thereof.

The Passivation layer 105 is disposed over the substrate 101 and covering the metal pad 104. In some embodiments, the passivation layer 105 is disposed on the surface 101d of the substrate 101. In some embodiments, the passivation layer 105 surrounds the die pad 108. In some embodiments, the passivation layer 105 includes an opening 105a above the top portion 108a of the die pad 108, such that the top portion 108a of the die pad 108 is exposed from the passivation layer 105. In some embodiments, the passivation layer 105 includes silicon nitride, silicon oxide or other insulting materials.

A post passivation interconnect (PPI) 109 is disposed over the passivation layer 105 in the circuit region 101b. In some embodiments, the PPI 109 is electrically connected with and routed from the die pad 108. In some embodiments, the PPI 109 includes copper, aluminum or other conductive materials.

The PPI 109 includes a via portion 109a and an elongated portion 109b. In some embodiments, the via portion 109a is extended towards the top portion 108a of the die pad 108 and is disposed within the opening 105a of the passivation layer 105. The via portion 109a is conformal to a sidewall of the opening 105a. In some embodiments, the elongated portion 109b is extended along a surface 105b of the passivation layer 105. In some embodiments, the elongated portion 109b is configured for receiving a conductive bump 110.

The polymeric layer 106 is disposed over the passivation layer 105 and the circuit region 101b. In some embodiments, the polymeric layer 106 surrounds and protects the PPI 109. In some embodiments, the polymeric layer 106 covers the via portion 109a of the PPI 109 while a portion of the elongated portion 109b of the PPI 109 is exposed from the polymeric layer 106. In some embodiments, the polymeric layer 106 includes polyimide (PI), polybenzoxazole (PBO) or other insulting materials.

Conductive bump 110 is disposed over the elongated portion 109b of the PPI 109. In some embodiments, a lower portion of an outer surface 110a of the conductive bump 110 is surrounded by the polymeric layer 106. In some embodiments, the conductive bump 110 is in a hemispherical shape as a solder ball. In some embodiments, the conductive bump 110 includes metals such as lead, tin copper, gold, nickel, etc. or metal alloy such as combination of lead, tin copper, gold, nickel, etc.

The molding 107 is disposed over the passivation layer 105 and the polymeric layer 106. In some embodiments, the molding 107 is disposed over the seal ring region 101a, the circuit region 101b and the assembly isolation region 101c. In some embodiments, the molding 107 is disposed around a portion of the external surface 110a of the conductive bump 110. The conductive bump 110 is partially encapsulated by the molding 107. A top portion of the external surface 110a of the conductive bump 110 is exposed from the molding 107. In some embodiments, the molding 107 covers the seal ring structure 102. The seal ring structure 102 is disposed underneath the molding 107 and the passivation layer 105.

In some embodiments, the molding 107 is formed with composite materials including epoxy resins, phenolic hardeners, silicas, catalysts, pigments and mold release agents. In some embodiments, the molding 107 has a high thermal conductivity, a low moisture absorption rate, a high flexural strength at board-mounting temperatures, or a combination of these. In some embodiments, the molding material 107 is a liquid molding compound (LMC).

Figure 2:
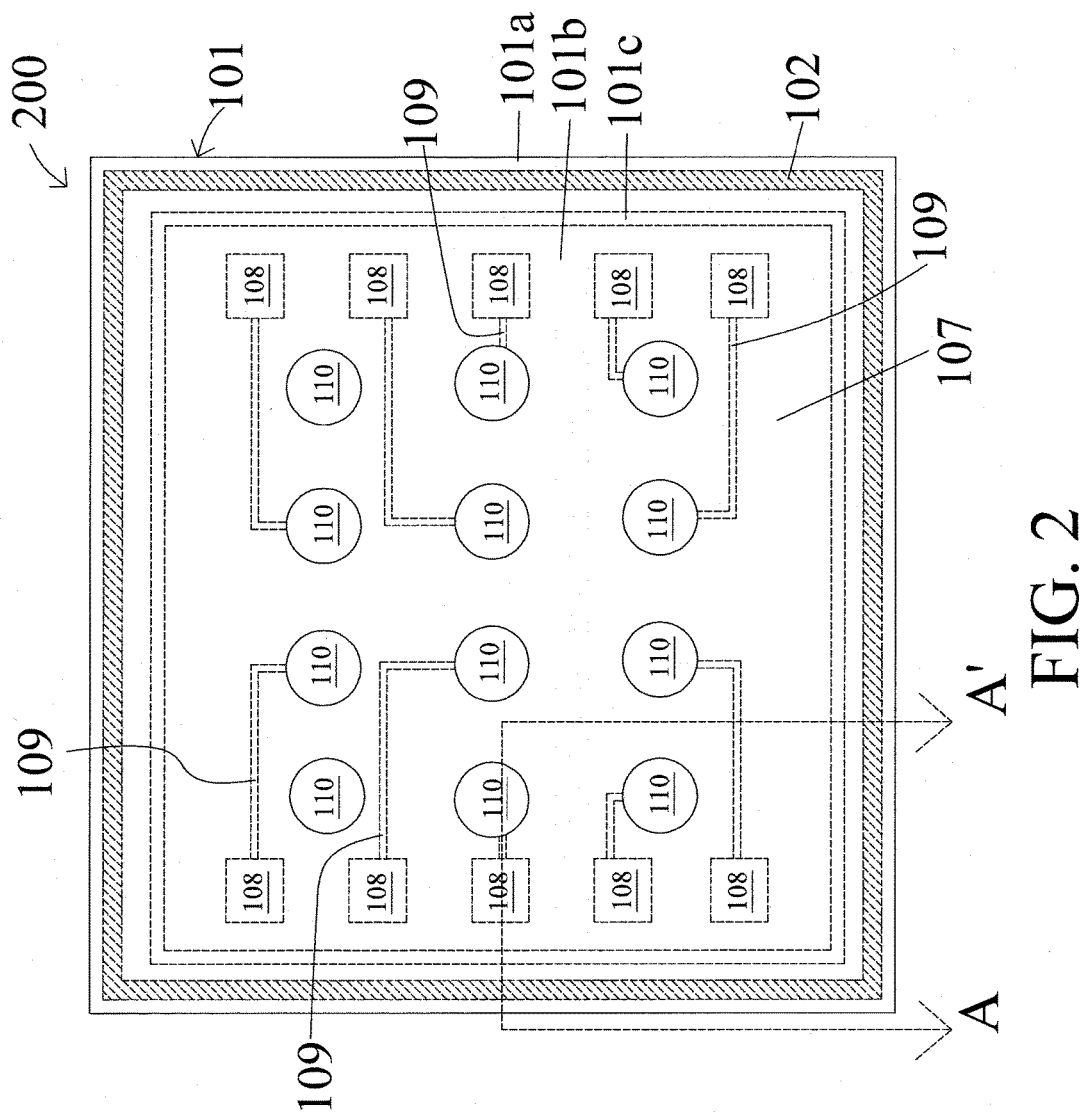
FIG. 2 is a top view of a semiconductor die in accordance with some embodiments of the present disclosure.

FIG. 2 is a top view of a semiconductor die 200 in accordance with various embodiments of the present disclosure. In some embodiments, the semiconductor die 200 includes a substrate 101, a seal ring structure 102, an integrated circuit stricture (not shown), a metal pad (not shown), a passivation layer (not shown), a polymeric layer (not shown), a die pad 108, a PPI 109, a conductive bump 110 and a molding 107, which are in similar configuration as in FIG. 1. The seal ring structure 102, the die pad 108 and the PPI 109 are covered by the molding 107 and thus are shown in broken lines. The top portion of the external surface 110a of the conductive bump 110 is exposed from the molding 107 and thus could be seen from the top view of the semiconductor die 200. In some embodiments, a cross sectional view of the semiconductor die 200 along AA' is the semiconductor device 100 of FIG. 1.

Referring to FIG. 2, the substrate 101 is defined with the seal ring region 101a, the circuit region 101b and the assembly isolation region 101c, which are in similar configuration as in FIG. 1. In some embodiments, the seal ring region 101a is the outermost peripheral region of the semiconductor die 200. In some embodiments, the seal ring region 101a is extended along a periphery of the semiconductor die 200. In some embodiments, the seal ring region 101a surrounds the circuit region 101b. In some embodiments, the seal ring region 101a is separated from the circuit region 101b by the assembly isolation region 101c.

In some embodiments, the seal ring structure 102 is disposed within and extended along the seal ring region 101a in a continuous line shape. In some embodiments, the seal ring structure 102 surrounds the integrated circuit structure 103 disposed within the circuit region 101b. The integrated circuit structure 103 is disposed under the die pad 108, the PPI 109 and the conductive bump 110.

Figure 3:
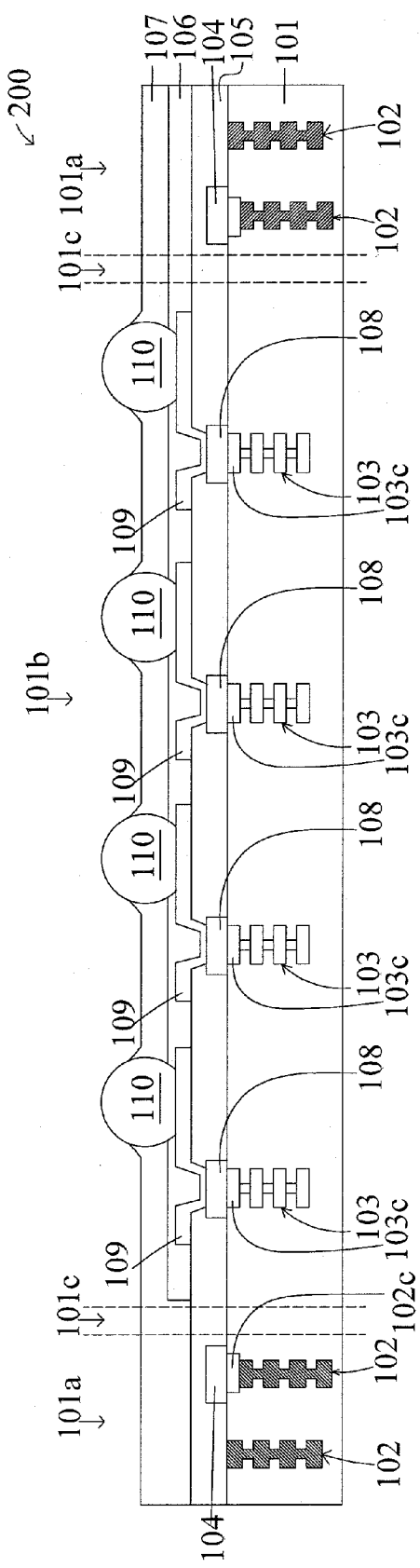
FIG. 3 is a cross sectional view of a semiconductor die of FIG. 2 in accordance with some embodiments of the present disclosure.

FIG. 3 is another cross sectional view of the semiconductor die 200 of FIG. 2. The integrated circuit structure 103, the die pad 104, the PPI 109 and the conductive bump 110 are disposed in the circuit region 101b, while the seal ring structure 102 is disposed in the seal ring region 101a. In some embodiments, the seal ring region 101a and the assembly isolation region 101c surrounds the circuit region 101b.

Figure 4:
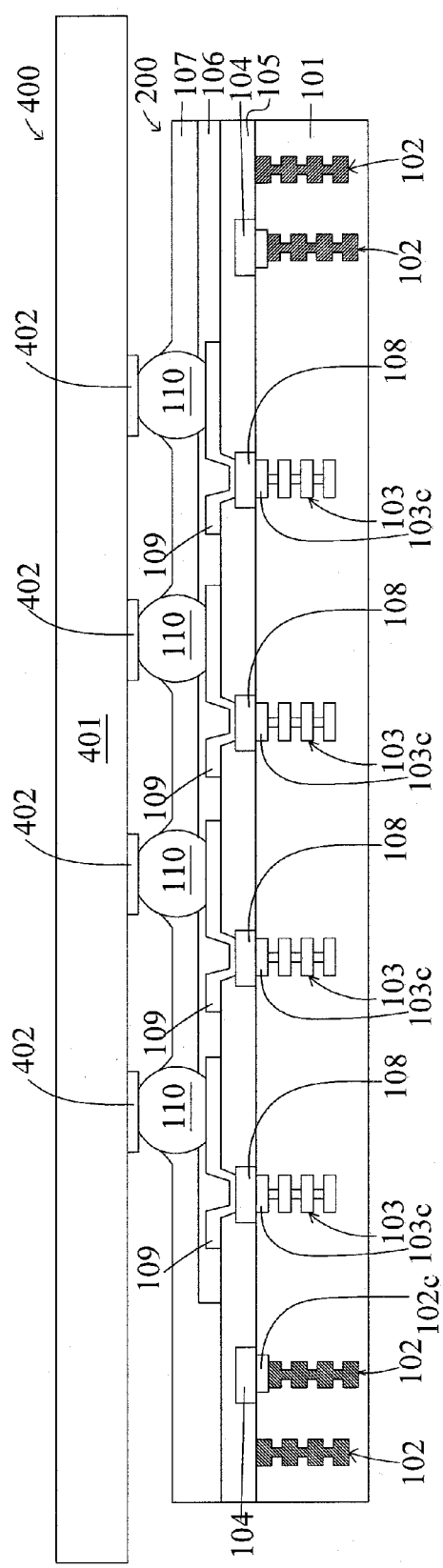
FIG. 4 is a schematic view of a semiconductor die bonded with another electronic device in accordance with some embodiments of the present disclosure.

FIG. 4 is the semiconductor die 200 of FIG. 2 bonded with another electronic device 400. In some embodiments, the electronic device 400 includes a substrate 401 and a bond pad 402. The semiconductor die 200 is bonded with the electronic device 400 by the conductive bump 110 and the bond pad 402, so that the integrated circuit structure 103 of the semiconductor die 200 is electrically connected with a circuitry of the substrate 401 of the electronic device 400. In some embodiments, the conductive bump 110 is bonded with a corresponding bond pad 402.

Figure 5:
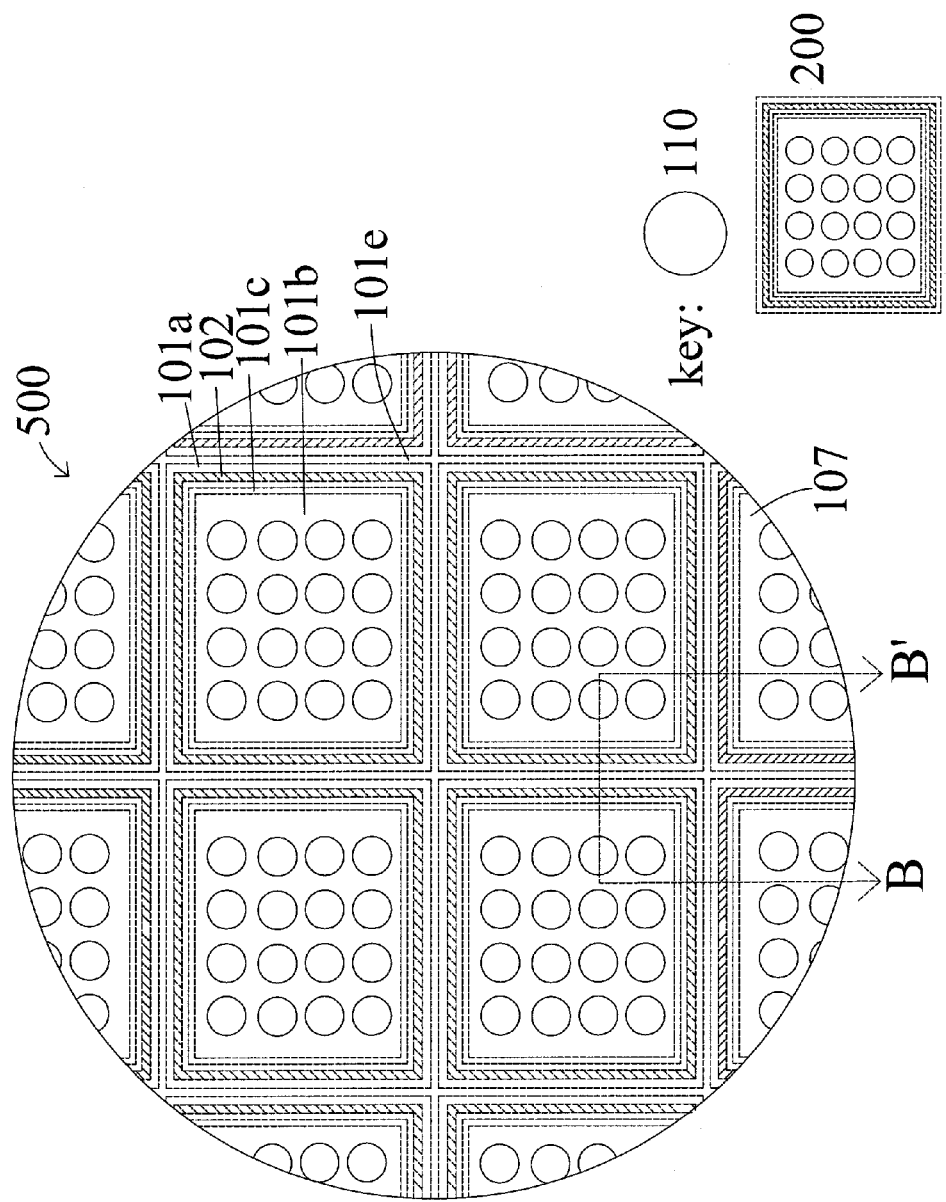
FIG. 5 is a schematic view of a semiconductor wafer including several semiconductor dies of FIG. 2 in accordance with some embodiments of the present disclosure.

FIG. 5 is a top view of several semiconductor dies 200 arranged in a regular array as a semiconductor wafer 500. In some embodiments, the semiconductor dies 200 are arranged and aligned with each other horizontally and vertically. In some embodiments, the semiconductor dies 200 are separated from each other by several scribe line regions 101e. In some embodiments, the scribe line regions 101e are configured for separating and singulating the semiconductor dies 200. In some embodiments, the semiconductor dies 200 are covered by the molding 107, while the conductive bumps 110 of the semiconductor dies 200 are exposed from the molding 107.

Figure 6:
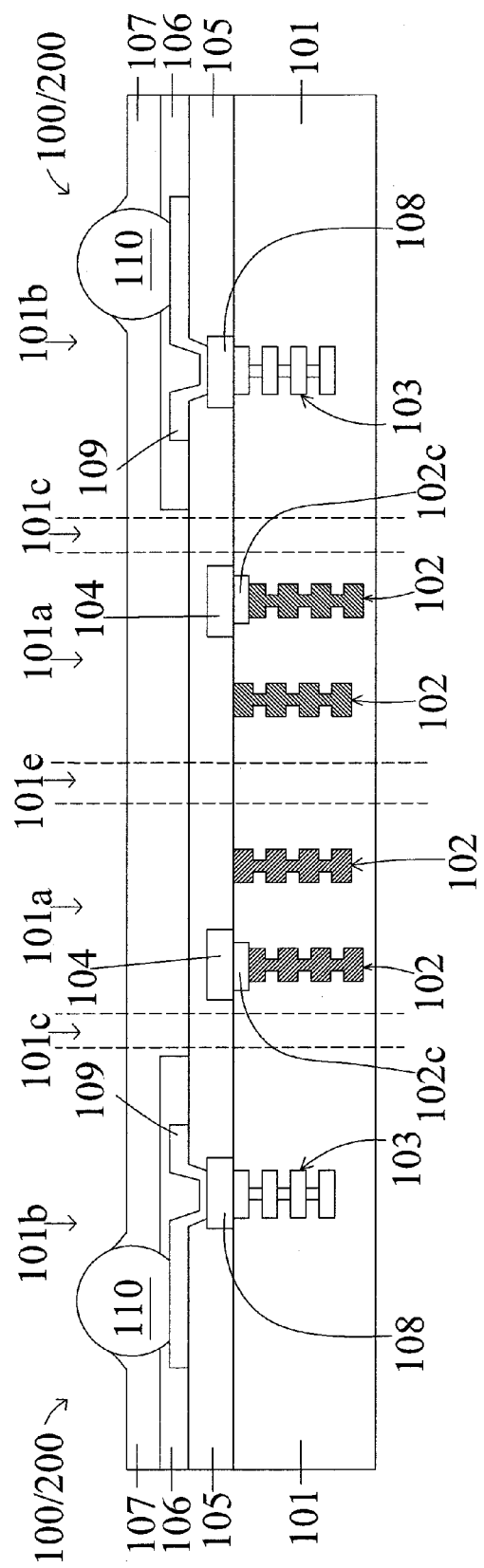
FIG. 6 is a schematic view of two adjacent semiconductor dies in accordance with some embodiments of the present disclosure.

FIG. 6 is a cross sectional view of the adjacent semiconductor dies 200 of FIG. 5 along BB'. In some embodiments, the scribe line region 101e is disposed between the adjacent semiconductor dies 200. In some embodiments, the scribe line region 101e is disposed between the seal ring regions 101a of two adjacent semiconductor dies 200.

Figure 7:
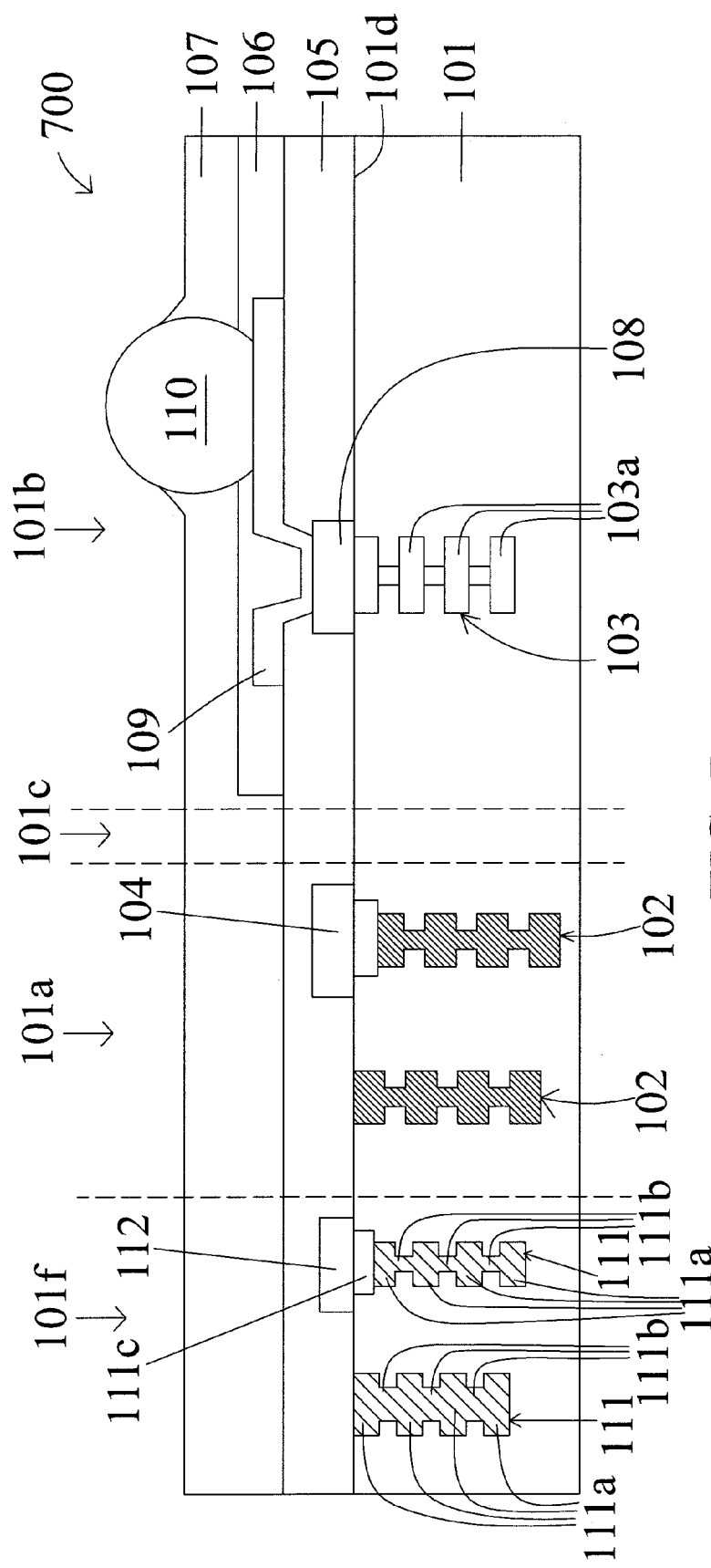
FIG. 7 is a schematic view of a semiconductor device in accordance with some embodiments of the present disclosure.

FIG. 7 is a semiconductor device 700 in accordance with various embodiments of the present disclosure. FIG. 7 shows a cross sectional view of the semiconductor device 700. In some embodiments, the semiconductor device 700 includes a substrate 101, a seal ring region 101a, a circuit region 101b, a metal pad 104, a passivation layer 105, a polymeric layer 106, a molding 107, a seal ring structure 102 and an integrated circuit structure 103 which are in similar configuration as in FIG. 1.

In some embodiments, the semiconductor device 700 further includes a dummy bar region 101f and a dummy bar structure 111. In some embodiments, the substrate 101 further defines the dummy bar region 101f neighboring the seal ring region 101a. In some embodiments, the dummy bar structure 111 is disposed in the dummy bar region 101f of the substrate 101. In some embodiments, the dummy bar structure 111 is covered by the passivation layer 105 and the molding 107.

In some embodiments, the dummy bar structure 111 includes conductive material such as aluminum or copper. In some embodiments, the dummy bar structure 111 includes a plurality of stacked conductive layers 111a, which are interconnected by a plurality of via layers 111b. In some embodiments, the stacked conductive layers 111a and the via layers 111b are disposed alternatively. In some embodiments, each of the stacked conductive layers 102a is extended along the dielectric layers or along a length of the substrate 101, and the stacked conductive layers 111a are stacked vertically along a thickness of the substrate 101. In some embodiments, the via layers 111b are extended along the thickness of the substrate 101 and passed through the dielectric layers to interconnect the stacked conductive layers 111a. In some embodiments, the dummy bar structure 111 further includes a top layer 111c disposed over or on a surface 101d of the substrate 101 and electrically connected with the stacked conductive layers 111a.

In some embodiments, the semiconductor device 700 further includes a dummy metal pad 112 disposed over the dummy bar region 101f of the substrate 101. In some embodiments, the dummy metal pad 112 is disposed on the substrate 101 and is contacted with the dummy bar structure 111 neighboring the seal ring structure 102. The dummy metal pad 112 is electrically connected with the stacked conductive layers 111a or the top layer 111c. In some embodiments, the dummy metal pad 112 is covered by the passivation layer 105 and the molding 107. In some embodiments, the dummy metal pad 112 includes aluminum, copper or other conductive materials.

Figure 8:
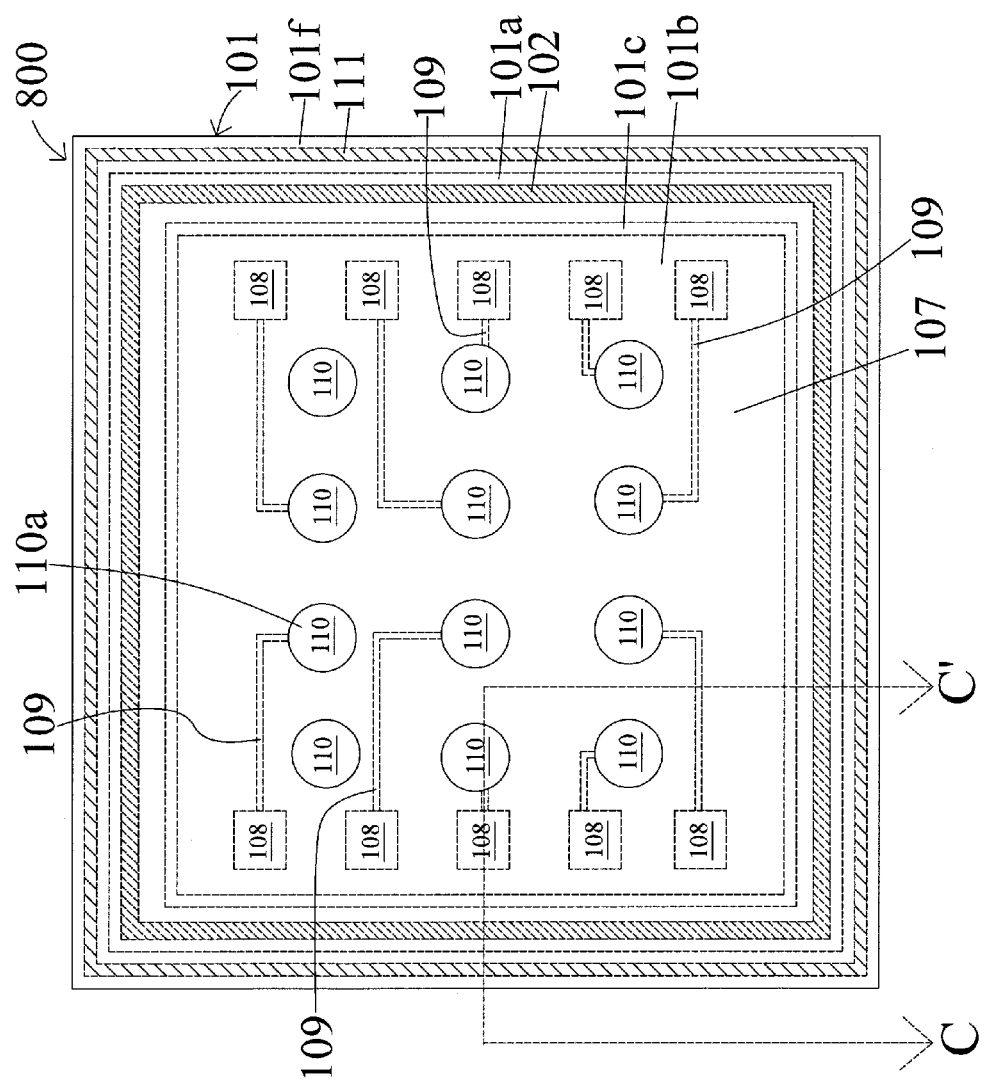
FIG. 8 is a top view of a semiconductor die in accordance with some embodiments of the present disclosure.

FIG. 8 is a top view of a semiconductor die 800 in accordance with various embodiments of the present disclosure. In some embodiments, the semiconductor die 800 includes a substrate 101, a seal ring structure 102, an integrated circuit stricture 103 (not shown), a metal pad 104 (not shown), a passivation layer 105 (not shown), a polymeric layer 106 (not shown), a die pad 108, a PPI 109, a conductive bump 110, a molding 107 and a dummy bar structure 111, which are in similar configuration as in FIG. 7. The seal ring structure 102, the dummy bar structure 111, the die pad 108 and the PPI 109 are covered by the molding 107 and thus are shown in broken lines. The top portion of the external surface 110a of the conductive bump 110 is exposed from the molding 107 and thus could be seen from the top view of the semiconductor die 800. In some embodiments, a cross sectional view of the semiconductor die 800 along CC' is the semiconductor device 700 of FIG. 7.

Referring to FIG. 8, the substrate 101 is defined with the seal ring region 101a, the dummy bar region 101f, the circuit region 101b and the assembly isolation region 101c which are in similar configuration as in FIG. 7. In some embodiments, the dummy bar region 101f is the outermost peripheral region of the semiconductor die 800. In some embodiments, the dummy bar region 101f is extended along a periphery of the semiconductor die 800. In some embodiments, the dummy bar region 101f surrounds the seal ring region 101a and the circuit region 101b.

In some embodiments, the dummy bar structure 111 is disposed within and extended along the dummy bar region 101f in a continuous line shape. In some embodiments, the dummy bar structure 111 surrounds the seal ring structure 102 and the integrated circuit structure 103.

Figure 9:
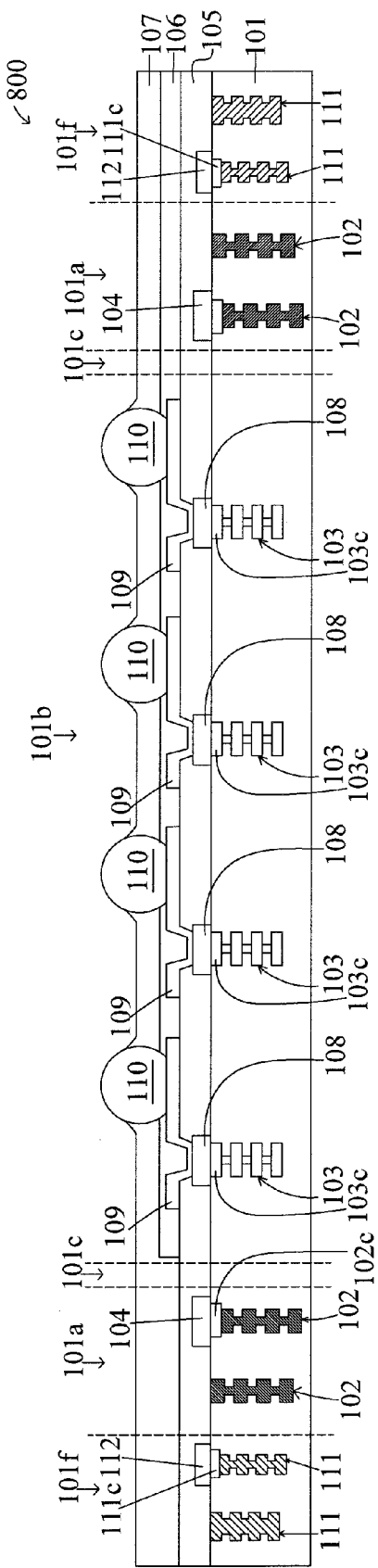
FIG. 9 is a cross sectional view of a semiconductor die of FIG. 8 in accordance with some embodiments of the present disclosure.

FIG. 9 is a cross sectional view of the semiconductor die 800 of FIG. 8. The integrated circuit structure 103, the die pad 104, the PPI 109 and the conductive bump 110 are disposed in the circuit region 101b, the seal ring structure 102 is disposed in the seal ring region 101a, and the dummy bar structure 111 is disposed in the dummy bar region 101f. In some embodiments, the circuit region 101b is surrounded by the seal ring region 101a and the dummy bar region 101f. The integrated circuit structure 103 is surrounded by the seal ring structure 102 and the dummy bar structure 111.

Figure 10:
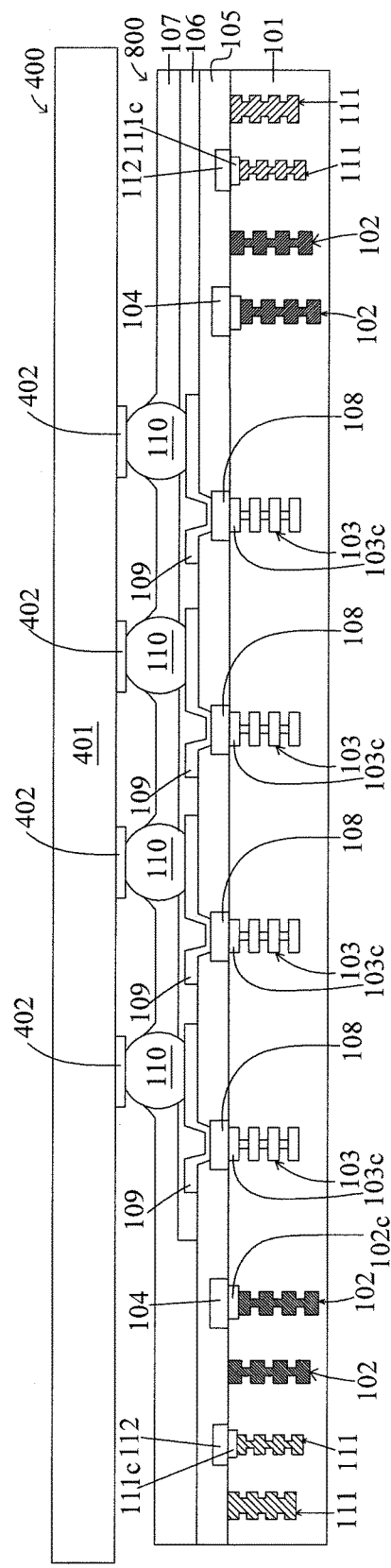
FIG. 10 is a schematic view of a semiconductor die bonded with another electronic device in accordance with some embodiments of the present disclosure.

FIG. 10 is the semiconductor die 800 of FIG. 8 bonded with another electronic device 400. In some embodiments, the electronic device 400 includes a substrate 401 and a bond pad 402. The semiconductor die 800 is bonded with the electronic device 400 by the conductive bump 110 and the bond pad 402, so that the integrated circuit structure 103 of the semiconductor die 800 is electrically connected with a circuitry of the substrate 401 of the electronic device 400. In some embodiments, the conductive bump 110 is bonded with a corresponding bond pad 402.

Figure 11:
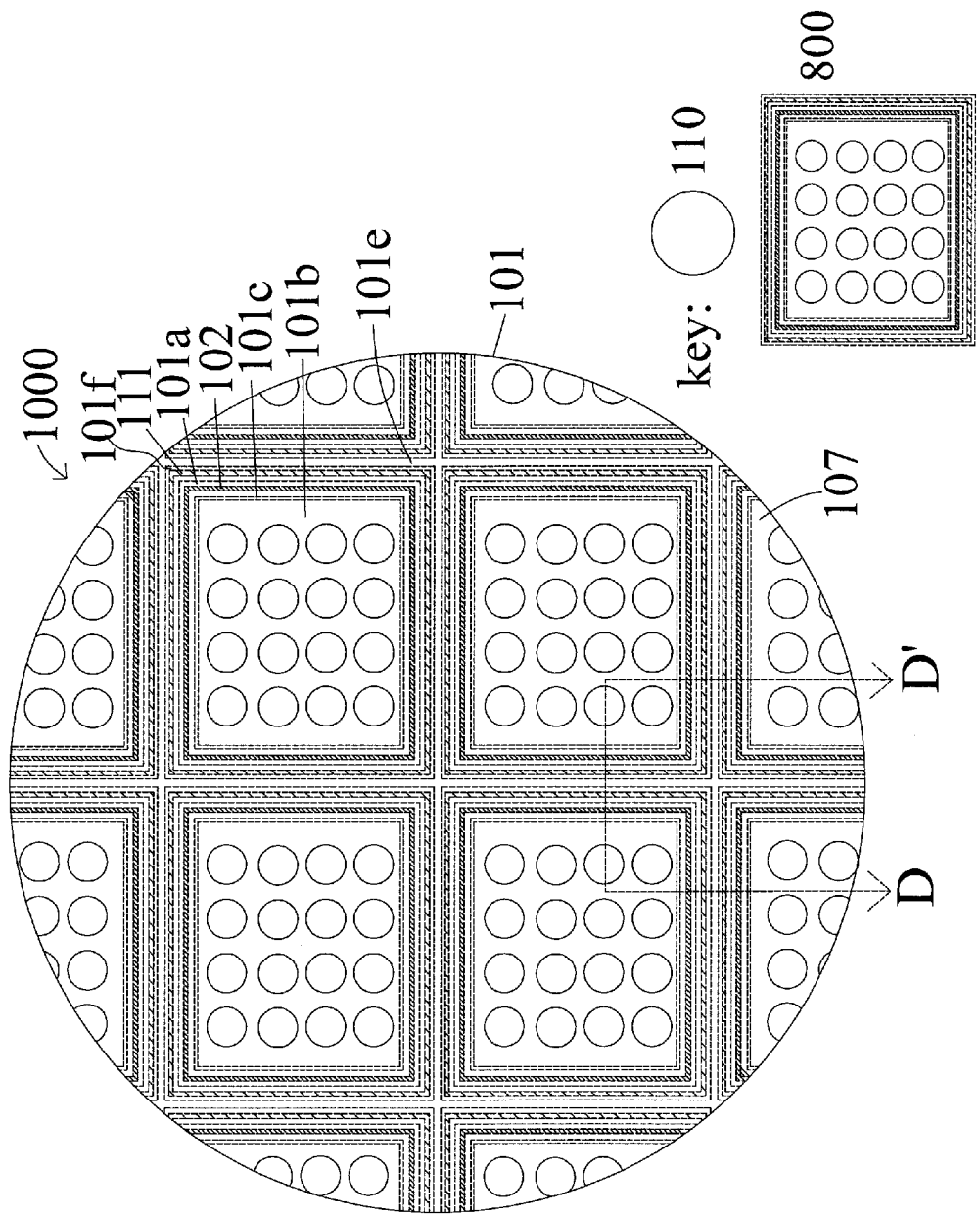
FIG. 11 is a schematic view of a semiconductor wafer including several semiconductor dies of FIG. 8 in accordance with some embodiments of the present disclosure.

FIG. 11 is a top view of several semiconductor dies 800 arranged in a regular array as a semiconductor wafer 1000. In some embodiments, the semiconductor dies 800 are arranged and aligned with each other horizontally and vertically. In some embodiments, the semiconductor dies 800 are separated from each other by several scribe line regions 101e. In some embodiments, the scribe line regions 101e are configured for separating and singulating the semiconductor dies 800. In some embodiments, the semiconductor dies 800 are covered by the molding 107, while the conductive bumps 110 of the semiconductor dies 800 are exposed from the molding 107. In some embodiments, the dummy bar region 101f is adjacent to the scribe line region 101e.

Figure 12:
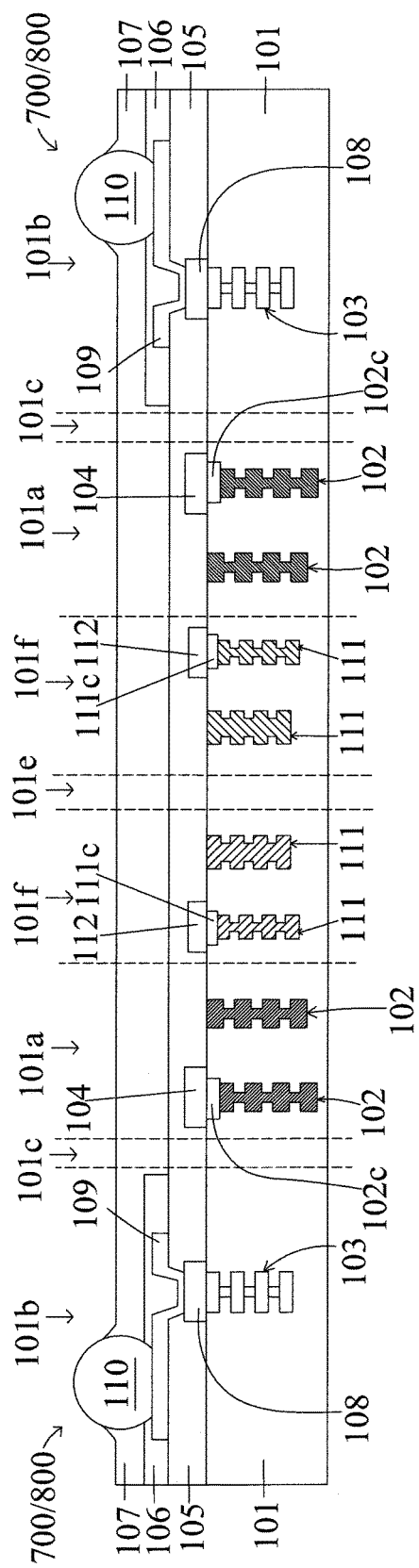
FIG. 12 is a schematic view of two adjacent semiconductor dies in accordance with some embodiments of the present disclosure.

FIG. 12 is a cross sectional view of the adjacent semiconductor dies 800 of FIG. 11 along DD'. In some embodiments, the scribe line region 101e is disposed between the adjacent semiconductor dies 800. In some embodiments, the scribe line region 101e is disposed between the dummy bar regions 101f of two adjacent semiconductor dies 200.

Figure 13:
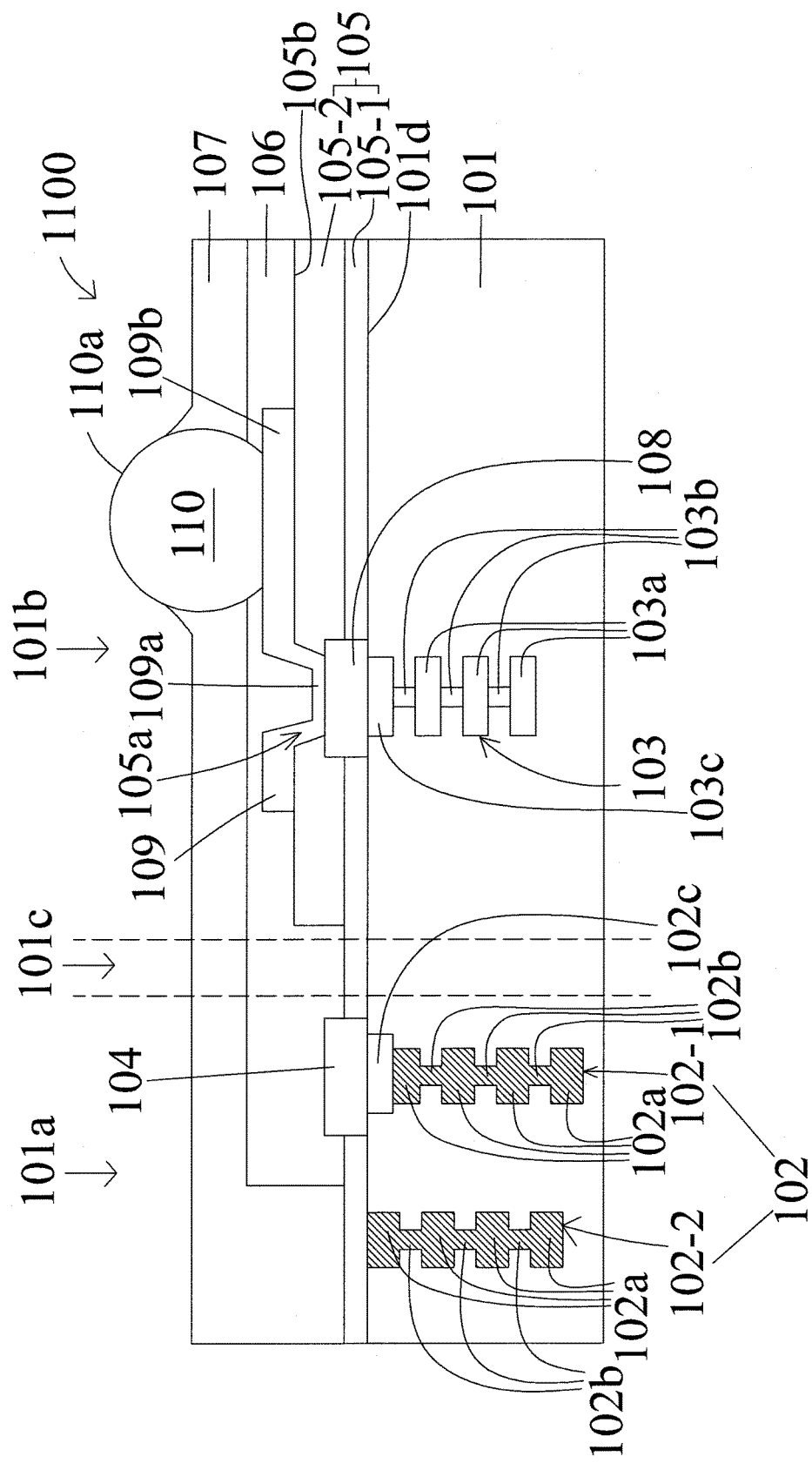
FIG. 13 is a schematic view of a semiconductor device in accordance with some embodiments of the present disclosure.

FIG. 13 is a semiconductor device 1100 in accordance with various embodiments of the present disclosure. FIG. 13 shows a cross sectional view of the semiconductor device 1100. In some embodiments, the semiconductor device 1100 includes a substrate 101, a metal pad 104, a polymeric layer 106 and a molding 107, which are in similar configuration as in FIG. 1. In some embodiments, the semiconductor device 1100 further includes a die pad 105, a PPI 109 and a conductive bump 110, which are configured as in FIG. 1.

In some embodiments, the substrate 101 includes an integrated circuit structure 103 disposed in a circuit region 101b as configured in FIG. 1 and an seal ring structure 102 disposed in a seal ring region 101a. In some embodiments, the seal ring structure 102 includes a first seal ring structure 102-1 and a second seal ring structure 102-2. In some embodiments, the first seal ring structure 102-1 and the second seal ring structure 102-2 are disposed in the seal ring region 101a. In some embodiments, each of the first seal ring structure 102-1 and the second seal ring structure 102-2 includes several stacked conductive layers 102a interconnected by several via layers 102b. In some embodiments, the metal pad 104 is disposed over and contacted with the first seal ring structure 102-1 through a top layer 102c.

In some embodiments, the semiconductor device 1100 includes a first passivation layer 105-1 and a second passivation layer 105-2. In some embodiments, the first passivation layer 105-1 is disposed over the substrate 101 and surrounds the metal pad 104. In some embodiments, the first passivation layer 105-1 also surrounds the die pad 108 disposed on the substrate 101 and connected with the integrated circuit structure 103. In some embodiments, the first passivation layer 105-1 is disposed in the circuit region 101b and the seal ring region 101a. The first passivation layer 105-1 covers the first seal ring structure 102-1, the second seal ring structure 102-2 and the integrated circuit structure 103.

In some embodiments, the second passivation layer 105-2 is disposed over the integrated circuit structure 103. In some embodiments, the second passivation layer 105-2 surrounds the die pad 108. In some embodiments, the PPI 109 is disposed over the second passivation layer 105-2. In some embodiments, the second passivation layer 105-2 includes an opening 105a for receiving a via portion 109a of the PPI 109. The second passivation layer 105-2 is disposed in the circuit region 101b only.

In some embodiments, the first passivation layer 105-1 and the second passivation layer 105-2 respectively include silicon nitride, silicon oxide or other insulting materials. In some embodiments, a thickness of the second passivation layer 105-2 is substantially greater than a thickness of the first passivation layer 105-1.

In some embodiments, the polymeric layer 106 is disposed over the second passivation layer 105-2. In some embodiments, the polymeric layer 106 is disposed in the seal ring region 101a and the circuit region 101b. In some embodiments, the polymeric layer 106 is disposed over the first seal ring structure 102-1. The polymeric layer 106 covers the first seal ring structure 102-2 and the metal pad 104.

In some embodiments, the molding 107 is disposed over the polymeric layer 106 and the first passivation layer 105-1. In some embodiments, the first seal ring structure 102-1 and the second seal ring structure 102-2 are covered by the molding 107.

Figure 14:
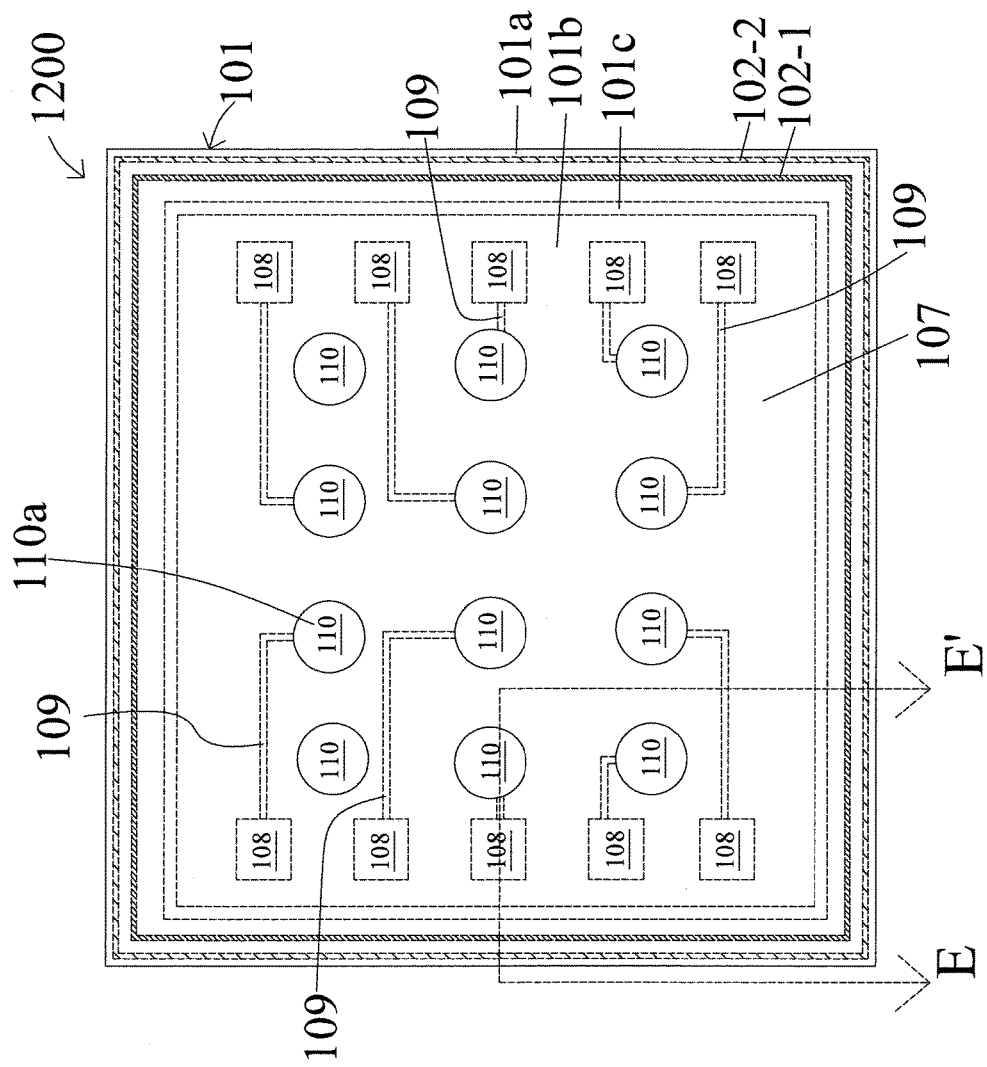
FIG. 14 is a top view of a semiconductor die in accordance with some embodiments of the present disclosure.

FIG. 14 is a top view of a semiconductor die 1200 in accordance with various embodiments of the present disclosure. In some embodiments, the semiconductor die 1200 is includes a substrate 101, a first seal ring structure 102-1, a second seal ring structure 102-2, an integrated circuit structure 103 (not shown), a metal pad 104 (not shown), a first passivation layer 105-1 (not shown), a second passivation layer 105-2, a polymeric layer 106 (not shown), a die pad 108, a PPI 109, a conductive bump 110 and a molding 107, which are in similar configuration as in FIG. 13. In some embodiments, a cross sectional view of the semiconductor die 1200 along EE' is the semiconductor device 1100 of FIG. 13.

Referring to FIG. 14, the first seal ring structure 102-1 and the second seal ring structure 102-2 are disposed within the seal ring region 101*a* and are extended along the seal ring region 101*a* in a continuous line shape respectively. In some embodiments, the second seal ring structure 102-2 surrounds the first seal ring structure 102-1 and the integrated circuit structure 103 disposed within the circuit region 101*b*.

Figure 15:
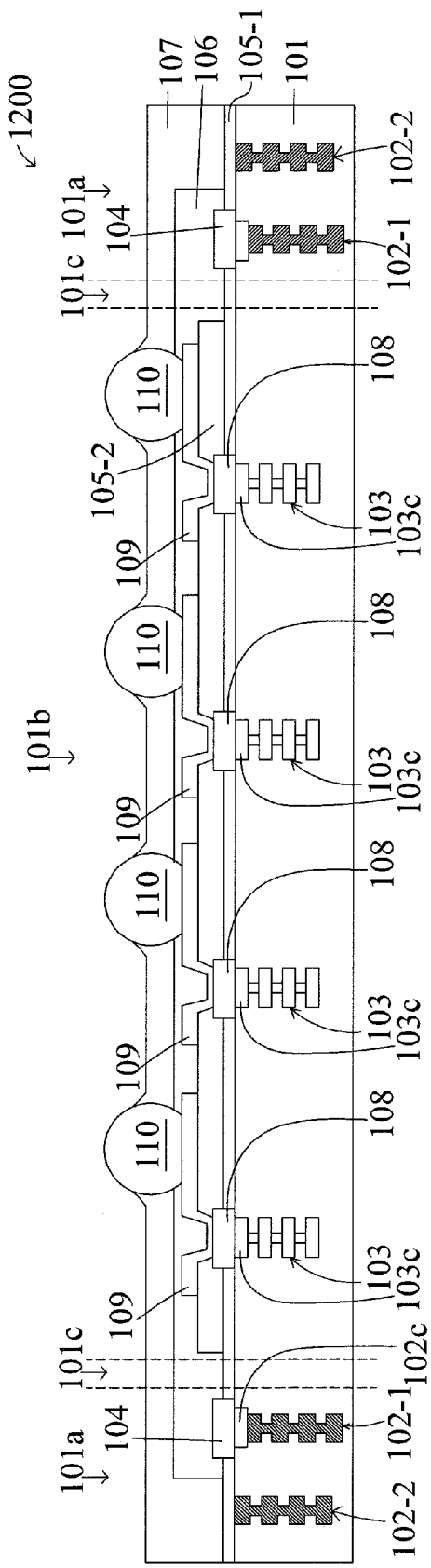
FIG. 15 is a cross sectional view of a semiconductor die of FIG. 14 in accordance with some embodiments of the present disclosure.

FIG. 15 is a cross sectional view of the semiconductor die 1200 of FIG. 14. In some embodiments, the first seal ring structure 102-1 is covered by the first passivation layer 105-1, the polymeric layer 106 and the molding 107, while the second seal ring structure 102-2 is covered by the first passivation layer 105-1 and the molding 107.

Figure 16:
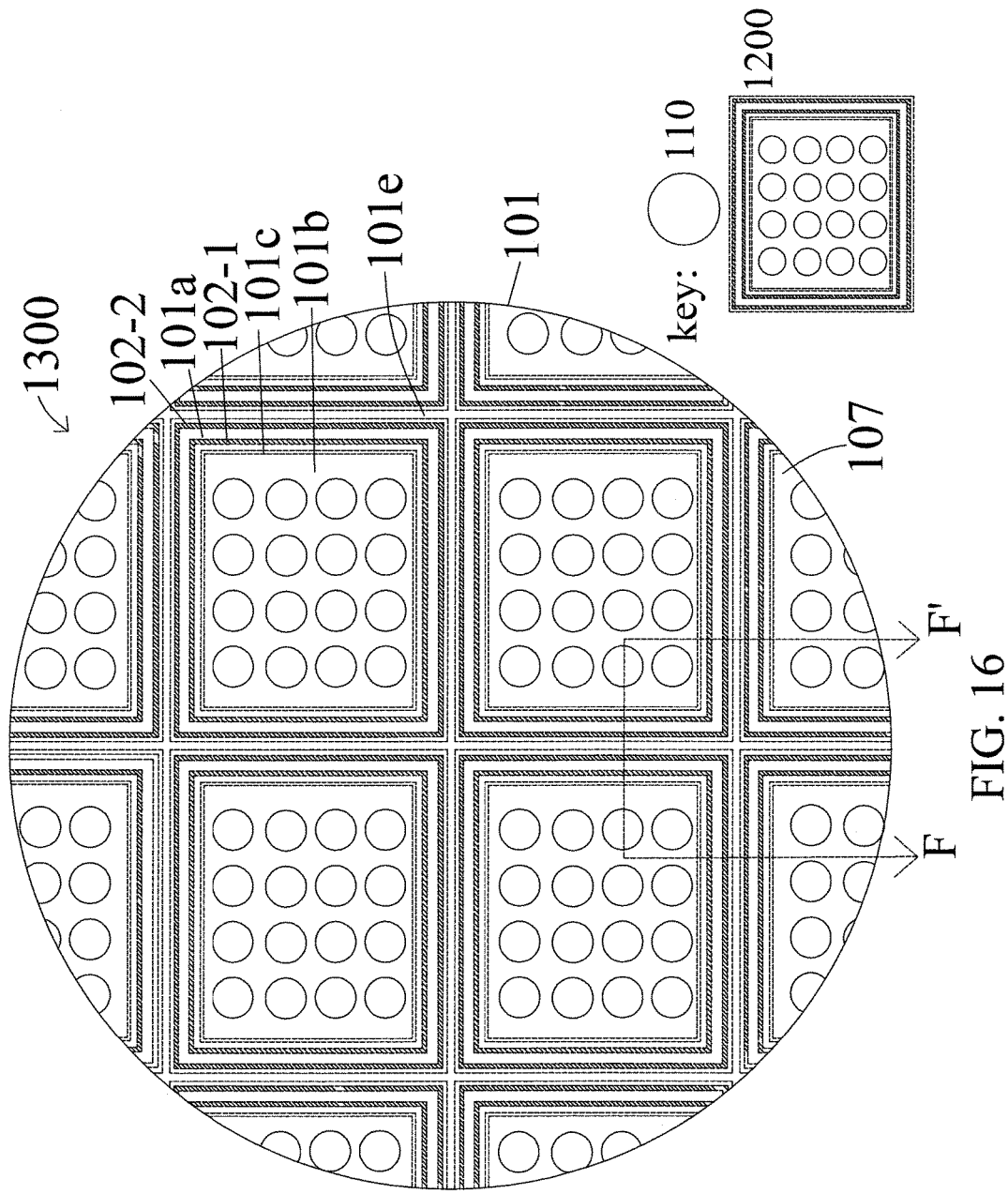
FIG. 16 is a schematic view of a semiconductor wafer including several semiconductor dies of FIG. 14 in accordance with some embodiments of the present disclosure.
Figure 17:
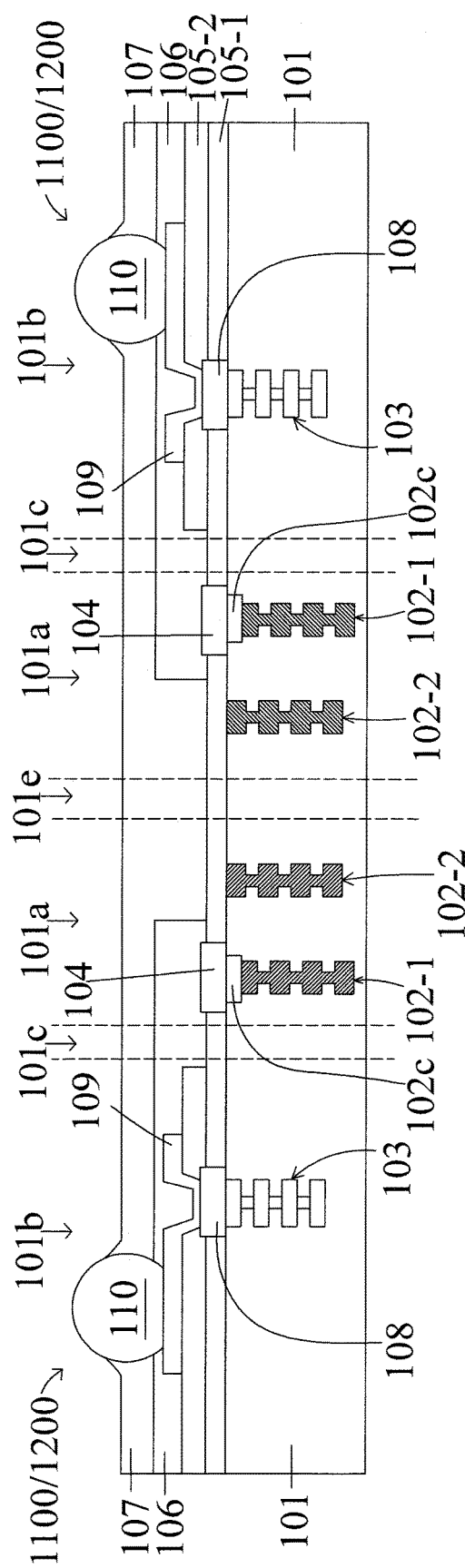
FIG. 17 is a schematic view of two adjacent semiconductor dies in accordance with some embodiments of the present disclosure.

FIG. 16 is a top view of several semiconductor dies 1200 arranged in a regular array as a semiconductor wafer 1300, in a similar manner as in FIG. 5. FIG. 17 is a cross sectional view of the adjacent semiconductor dies 1200 of FIG. 16 along FF'. In some embodiments, the scribe line region 101*e* is disposed between the second seal ring structures 102-2 of two adjacent semiconductor dies 1200.

Figure 18:
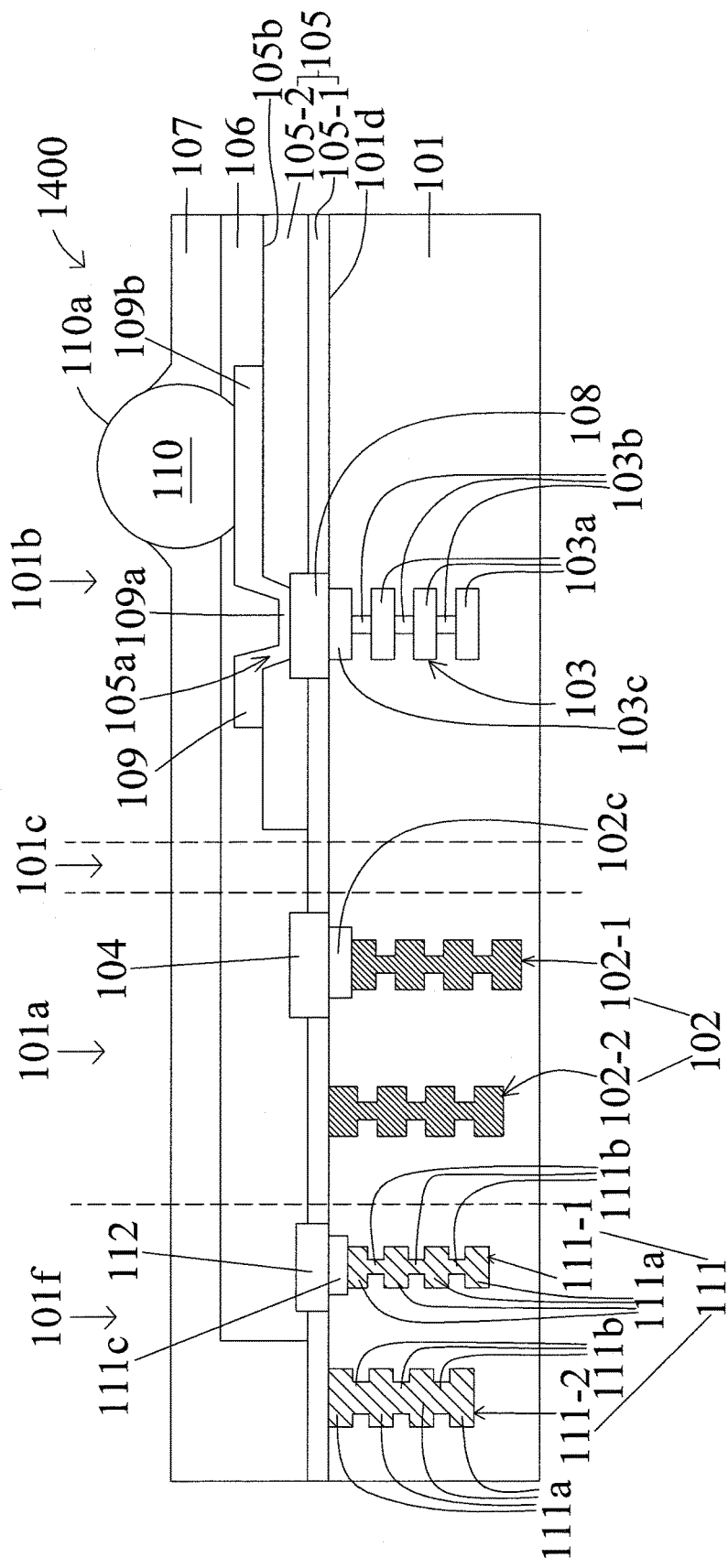
FIG. 18 is a schematic view of a semiconductor device in accordance with some embodiments of the present disclosure.

FIG. 18 is a semiconductor device 1400 in accordance with various embodiments of the present disclosure. FIG. 18 shows a cross sectional view of the semiconductor device 1400. In some embodiments, the semiconductor device 1400 is in similar configuration as in FIG. 7. In some embodiments, the second seal ring structure 102-2 is covered by the first passivation layer 105-1, the polymeric layer 106 and the molding 107. In some embodiments, the semiconductor device 1400 further includes a first dummy bar structure 111-1 and a second dummy bar structure 111-2, which are disposed in a dummy bar region 101*f*. In some embodiments, the first dummy bar structure 111-1 and the second dummy bar structure 111-2 respectively include several stacked conductive layers 111*a* and several via layers 111*b*.

In some embodiments, a dummy metal pad 112 is disposed over and contacted with the first dummy bar structure 111-1. In some embodiments, the dummy metal pad 112 is surrounded by the first passivation layer 105-1. In some embodiments, the first dummy bar structure 111-1 is covered by the first passivation layer 105-1, the polymeric layer 106 and the molding 107. In some embodiments, the first dummy bar structure 111-1 is adjacent to the second seal ring structure 102-2. In some embodiments, the second dummy bar structure 111-2 is adjacent to the first dummy bar structure 111-1. In some embodiments, the second dummy bar structure 111-2 is covered by the first passivation layer 105-1 and the molding 107.

Figure 19:
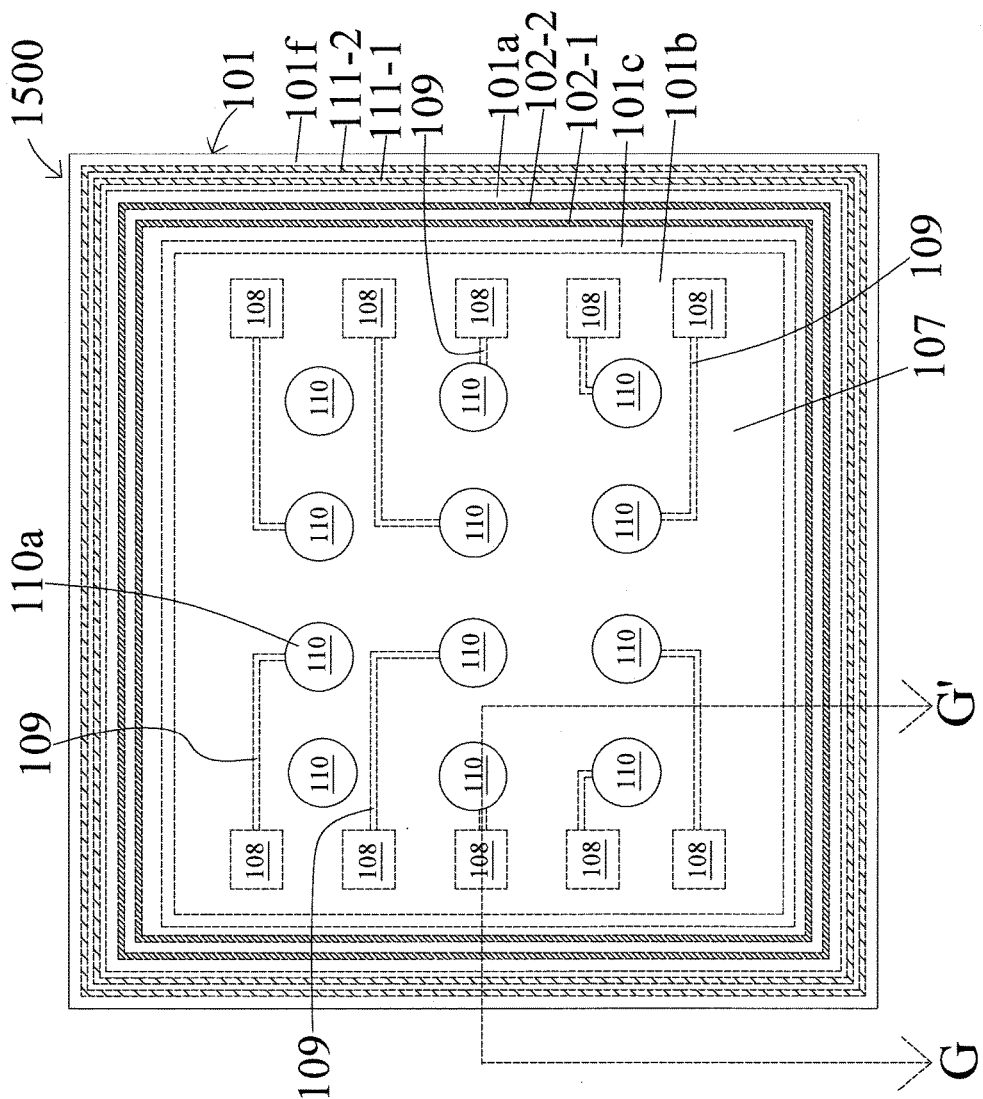
FIG. 19 is a top view of a semiconductor die in accordance with some embodiments of the present disclosure.

FIG. 19 is a top view of a semiconductor die 1500 in accordance with various embodiments of the present disclosure. In some embodiments, the semiconductor die 1500 has similar configuration as in FIG. 8. In some embodiments, the semiconductor die 1500 includes a first seal ring structure 102-1, a second seal ring structure 102-2, a first dummy bar structure 111-1 and a second dummy bar structure 111-2. In some embodiments, the second dummy bar structure 111-2 surrounds the first dummy bar structure 111-1, the first seal ring structure 102-1 and the second seal ring structure 102-2. In some embodiments, a cross sectional view of the semiconductor die 1500 along GG' is the semiconductor device 1400 of FIG. 18.

Figure 20:
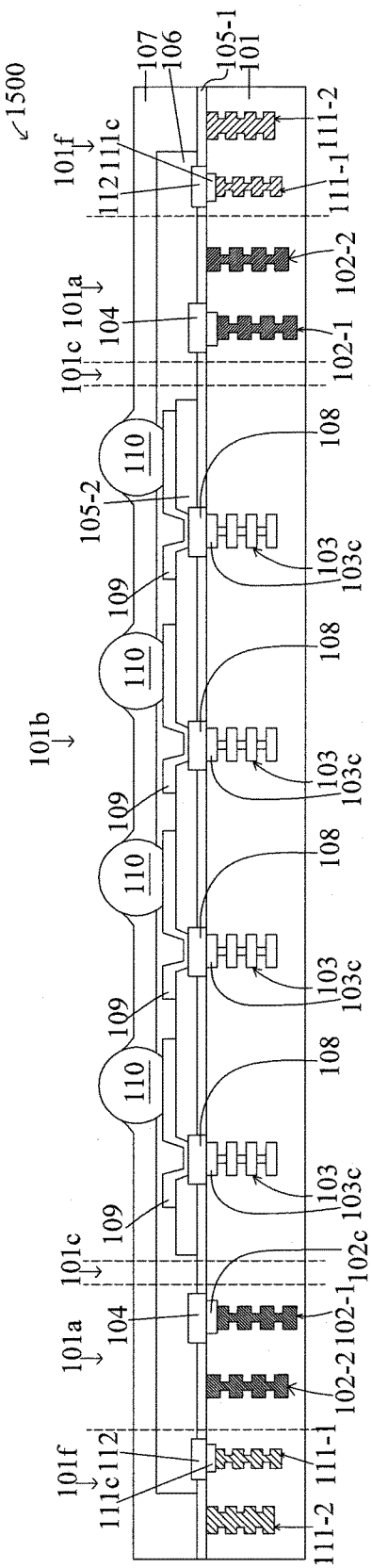
FIG. 20 is a cross sectional view of a semiconductor die of FIG. 19 in accordance with some embodiments of the present disclosure.

FIG. 20 is a cross sectional view of the semiconductor die 1500 of FIG. 19, which is in similar configuration as in FIG. 9. In some embodiments, the second passivation layer 105-2 is disposed in the seal ring region 101*a*. In some embodiments, the first seal ring structure 102-1, the second seal ring structure 102-2 and the first dummy bar structure 111-1 are covered by the first passivation layer 105-1 and the polymeric layer 106. In some embodiments, the second dummy bar structure 111-2 is covered by the first passivation layer 105-1 and the molding 107.

Figure 21:
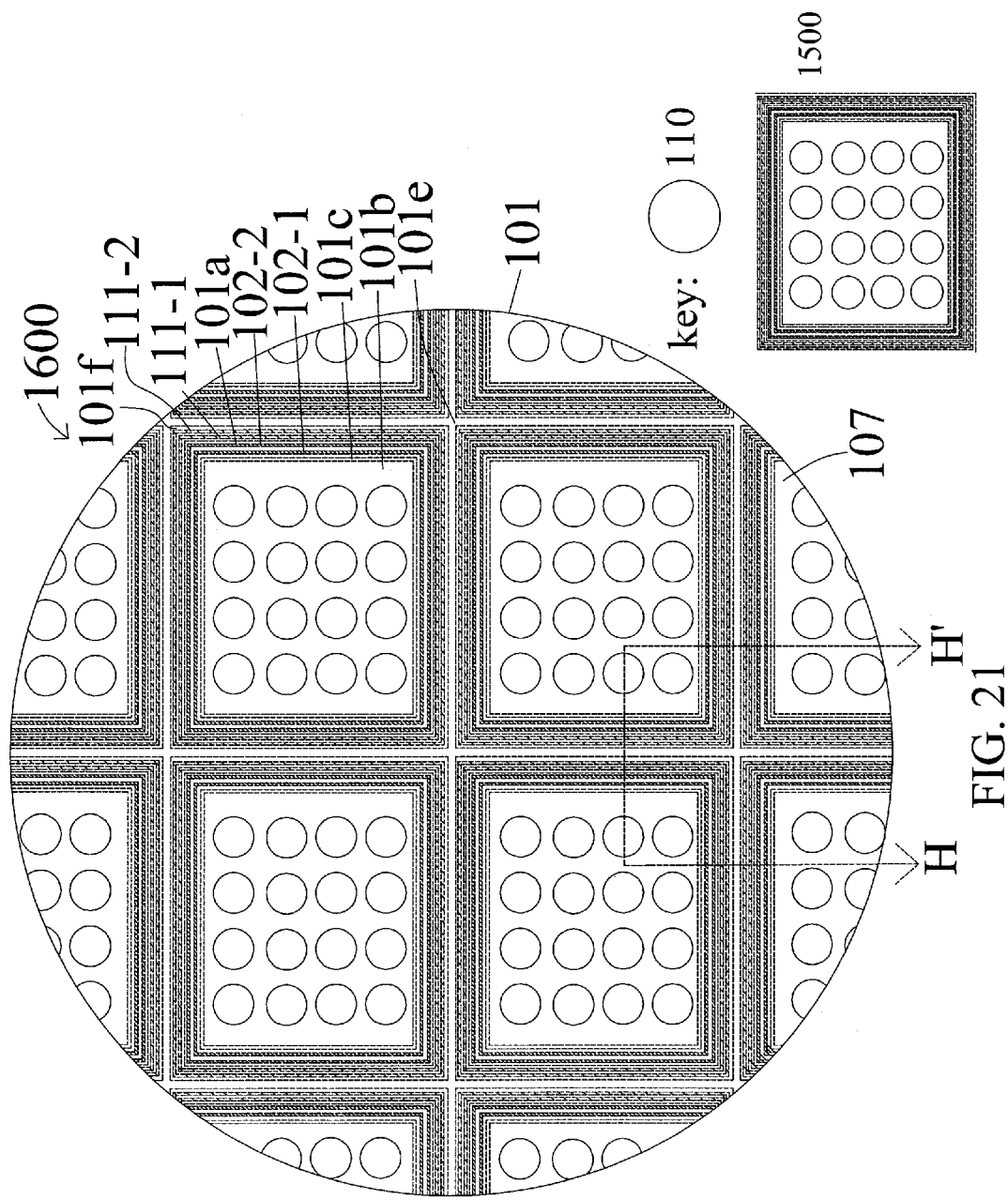
FIG. 21 is a schematic view of a semiconductor wafer including several semiconductor dies of FIG. 19 in accordance with some embodiments of the present disclosure.
Figure 22:
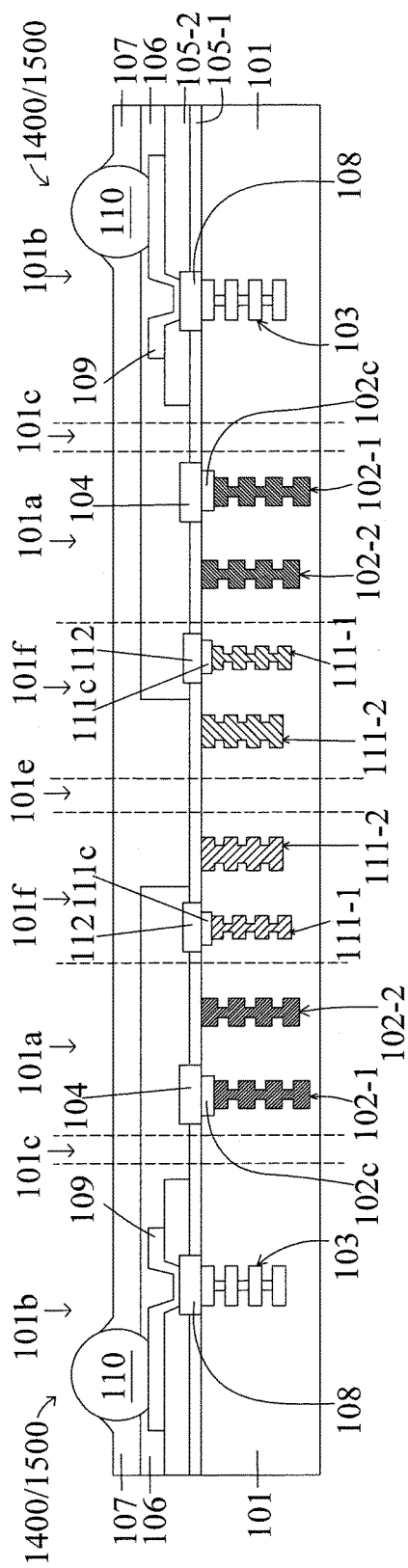
FIG. 22 is a schematic view of two adjacent semiconductor dies in accordance with some embodiments of the present disclosure.

FIG. 21 is a top view of several semiconductor dies 1500 arranged in a regular array as a semiconductor wafer 1600 in a similar manner as in FIG. 11. FIG. 22 is a cross sectional view of the adjacent semiconductor dies 1500 of FIG. 21 along HH'. In some embodiments, the scribe line region 101*e* is disposed between the second dummy bar structures 111-2 of two adjacent semiconductor dies 1200.

Figure 23:
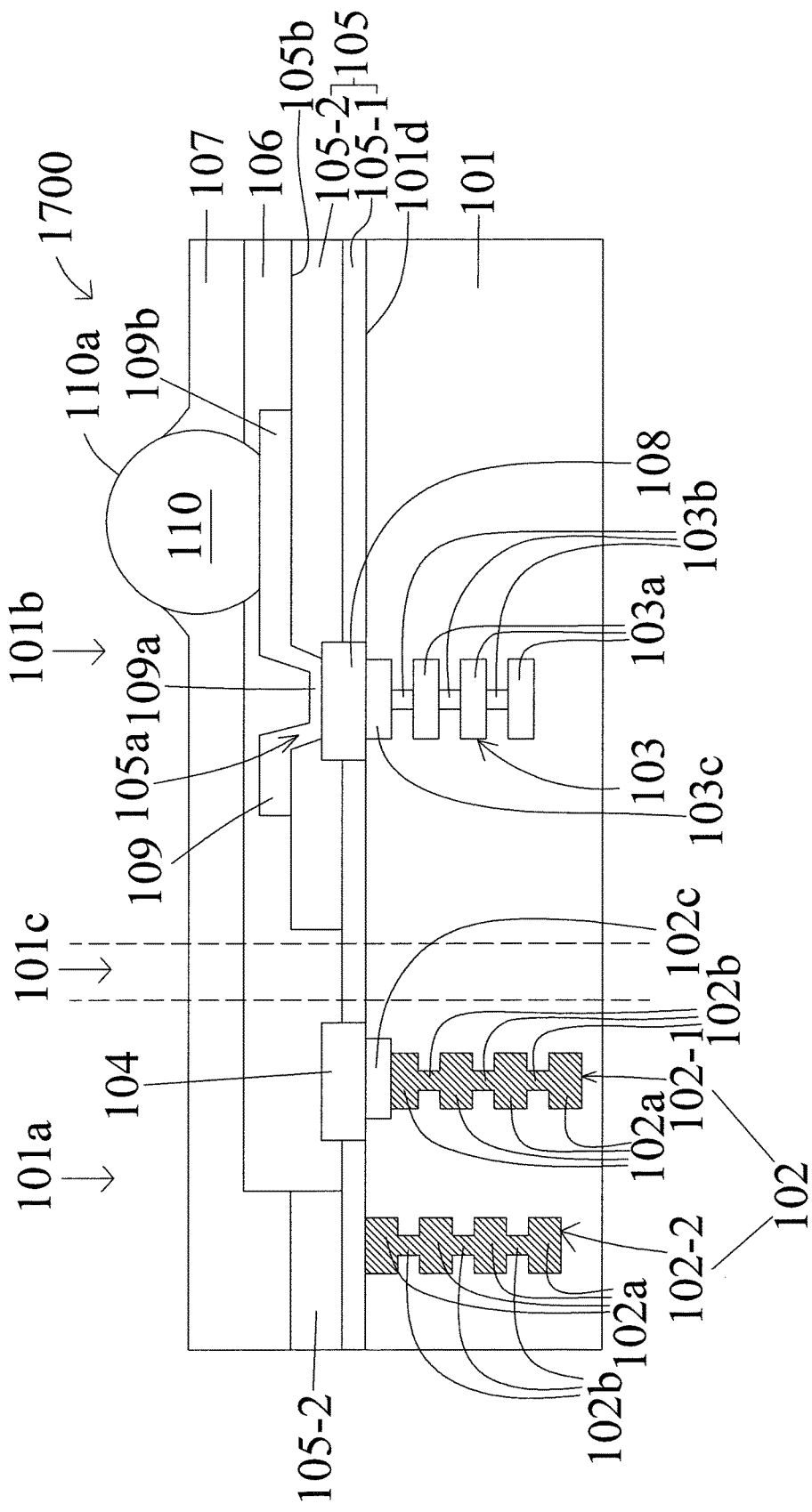
FIG. 23 is a schematic view of a semiconductor device in accordance with some embodiments of the present disclosure.

FIG. 23 is a semiconductor device 1700 in accordance with various embodiments of the present disclosure. FIG. 23 shows a cross sectional view of the semiconductor device 1700. In some embodiments, the semiconductor device 1700 is in similar configuration as FIG. 13. In some embodiments, the semiconductor device 1700 includes a second passivation layer 105-2 disposed in the circuit region 101*b* and the seal ring region 101*a*. In some embodiments, the second seal ring structure 102-2 is covered by the first passivation layer 105-1 and the second passivation layer 105-2.

Figure 24:
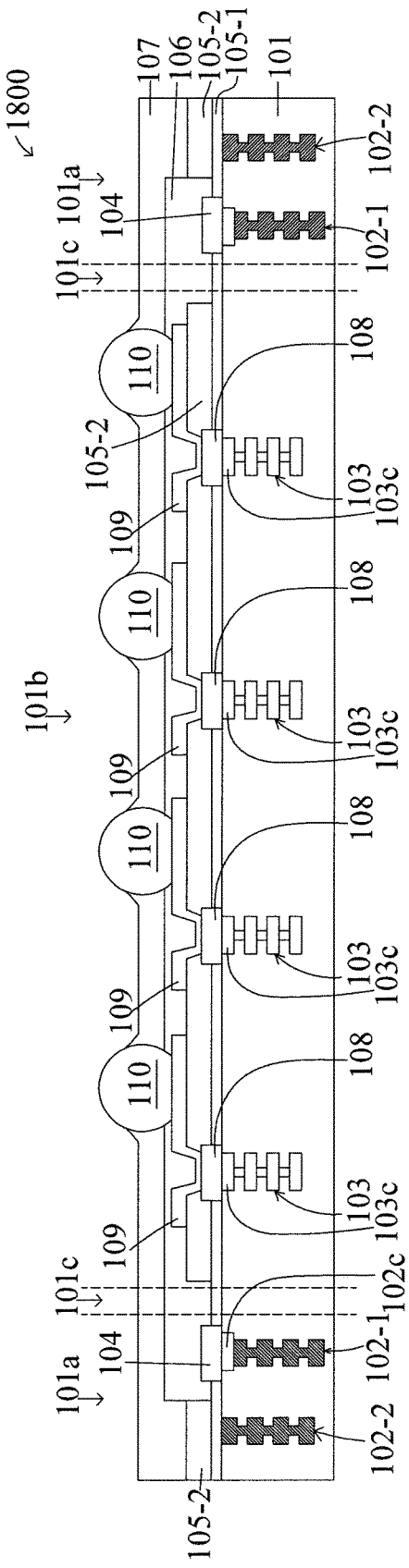
FIG. 24 is a cross sectional view of a semiconductor die in accordance with some embodiments of the present disclosure.
Figure 25:
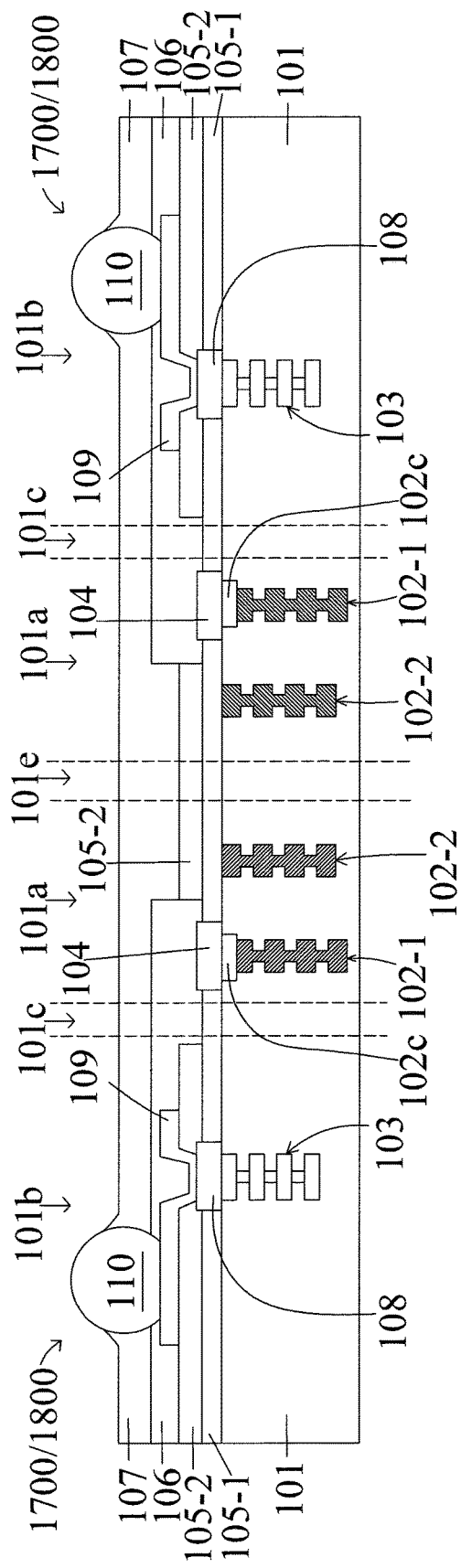
FIG. 25 is a schematic view of two adjacent semiconductor dies in accordance with some embodiments of the present disclosure.

FIG. 24 is a cross sectional view of a semiconductor die 1800. In some embodiments, the semiconductor die 1800 is in similar configuration as in FIG. 15. In some embodiments, the second passivation layer 105-2 covers the second seal ring structure 102-2. In some embodiments, several semiconductor dies 1800 are arranged in a regular array as a semiconductor wafer, in a similar manner as in FIG. 16. FIG. 25 is a cross sectional view of the adjacent semiconductor dies 1800. In some embodiments, the second passivation layer 105-2 is disposed over the second seal ring structure 102-2 and disposed in the scribe line region 101*e*.

Figure 26:
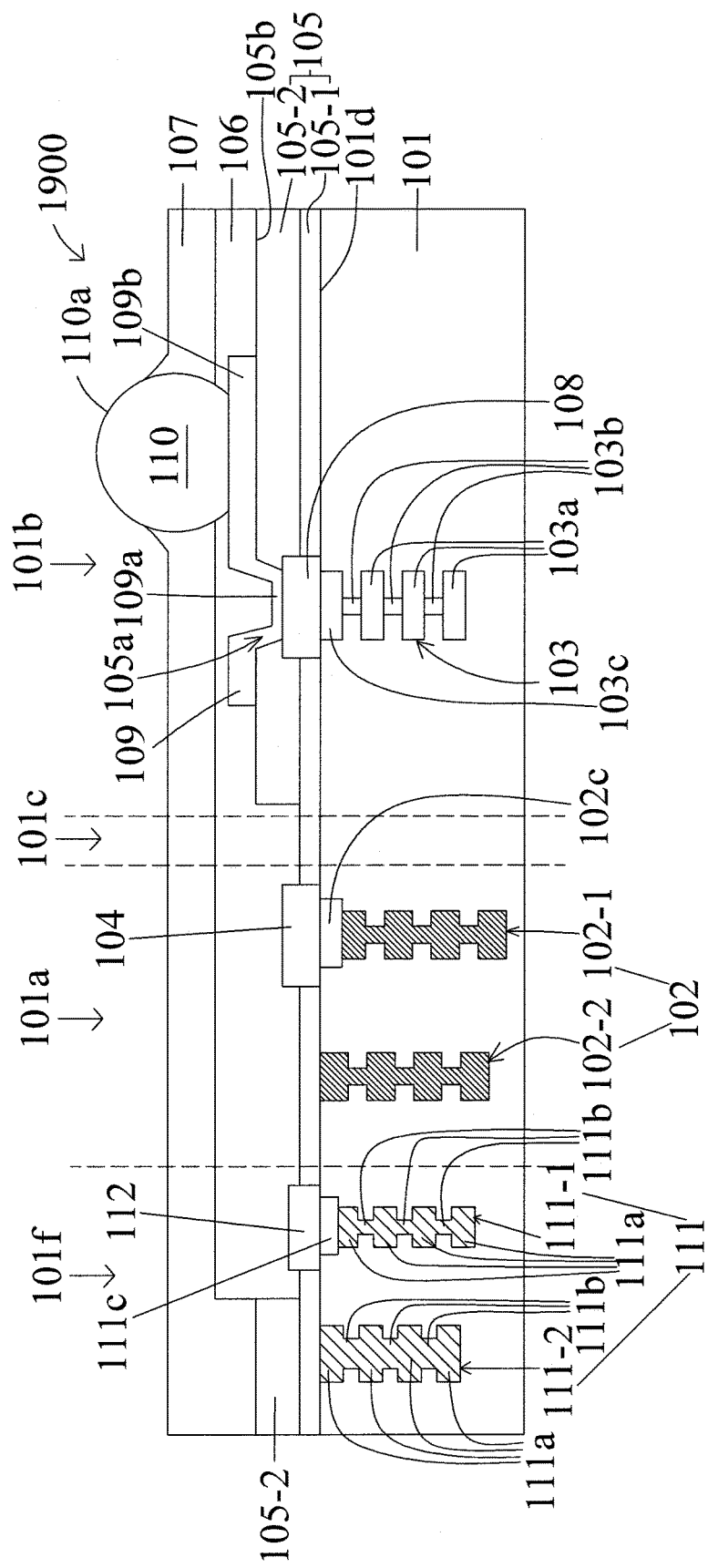
FIG. 26 is a schematic view of a semiconductor device in accordance with some embodiments of the present disclosure.

FIG. 26 is a semiconductor device 1900 in accordance with various embodiments of the present disclosure. FIG. 26 shows a cross sectional view of the semiconductor device 1900. In some embodiments, the semiconductor device 1900 is in similar configuration as in FIG. 18. In some embodiments, the second passivation layer 105-2 is disposed in the dummy bar region 101*f*. In some embodiments, the first seal ring structure 102-1 and the second seal ring structure 102-2 are covered by the first passivation layer 105-1, the polymeric layer 106 and the molding 107. In some embodiments, the first dummy bar structure 111-1 is covered by the polymeric layer 106 and the molding 107. In some embodiments, the second dummy bar structure 111-2 is covered by the first passivation layer 105-1, the second passivation layer 105-2 and the molding 107.

Figure 27:
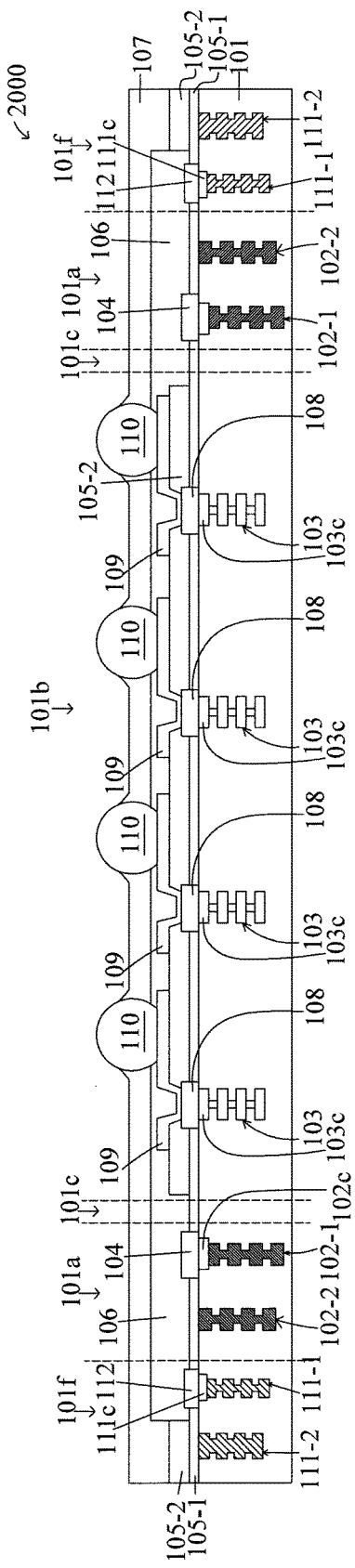
FIG. 27 is a cross sectional view of a semiconductor die in accordance with some embodiments of the present disclosure.

FIG. 27 is a cross sectional view of the semiconductor die 2000 of FIG. 26, which is in similar configuration as in FIG. 20. In some embodiments, the first seal ring structure 102-1, the second seal ring structure 102-2 and the first dummy bar structure 111-1 are covered by the first passivation layer 105-1 and the polymeric layer 106. In some embodiments, the second dummy bar structure 111-2 is covered by the first passivation layer 105-1, the second passivation layer 105-2 and the molding 107.

Figure 28:
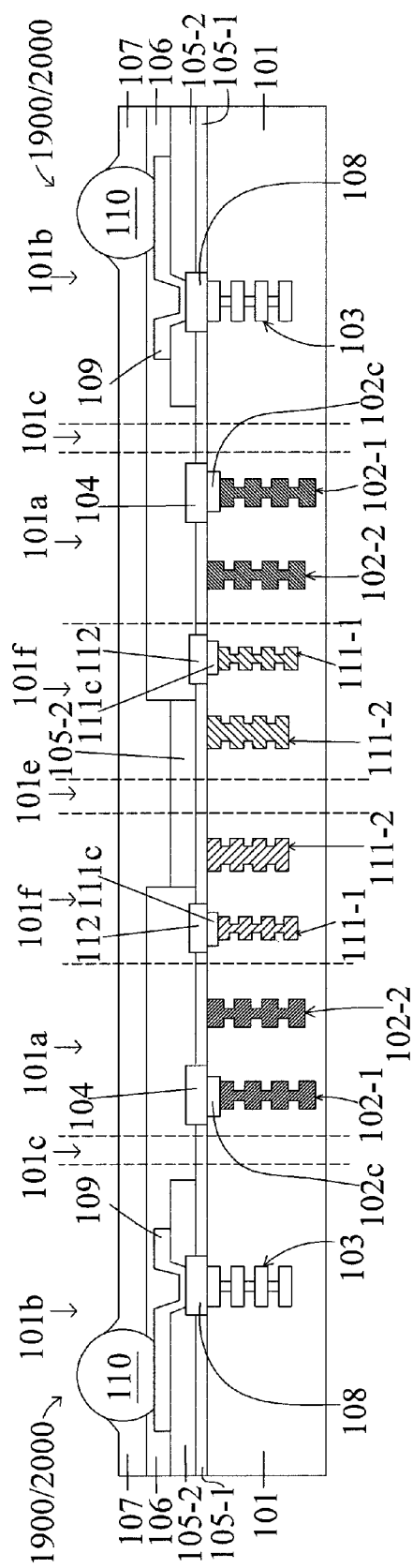
FIG. 28 is a schematic view of two adjacent semiconductor dies in accordance with some embodiments of the present disclosure.

In some embodiments, several semiconductor dies 2000 are arranged in a regular array as a semiconductor wafer, in a similar manner as in FIG. 21. FIG. 28 is a cross sectional view of the adjacent semiconductor dies 2000 of FIG. 27. In some embodiments, the second passivation layer 105-2 is disposed over the second dummy bar structure 111-2 and disposed in the scribe line region 101*e*.

Figure 29:
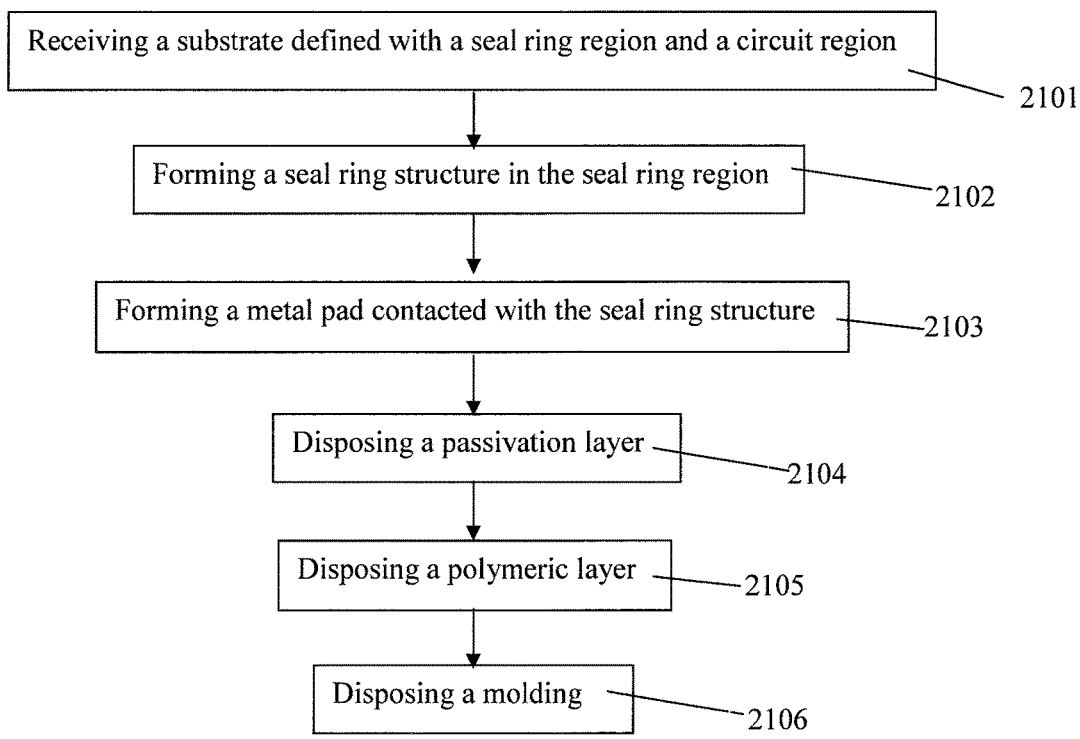
FIG. 29 is a flow diagram of a method of manufacturing a semiconductor device in accordance with some embodiments of the present disclosure.

In the present disclosure, a method of manufacturing a semiconductor device is also disclosed. In some embodiments, a semiconductor device is formed by a method 2100. The method 2100 includes a number of operations and the description and illustration are not deemed as a limitation as the sequence of the operations. FIG. 29 is a diagram of a method 2100 of manufacturing a semiconductor device in accordance with various embodiments of the present disclosure. The method 2100 includes a number of operations (2101, 2102, 2103, 2104, 2105 and 2106).

Figure 30:
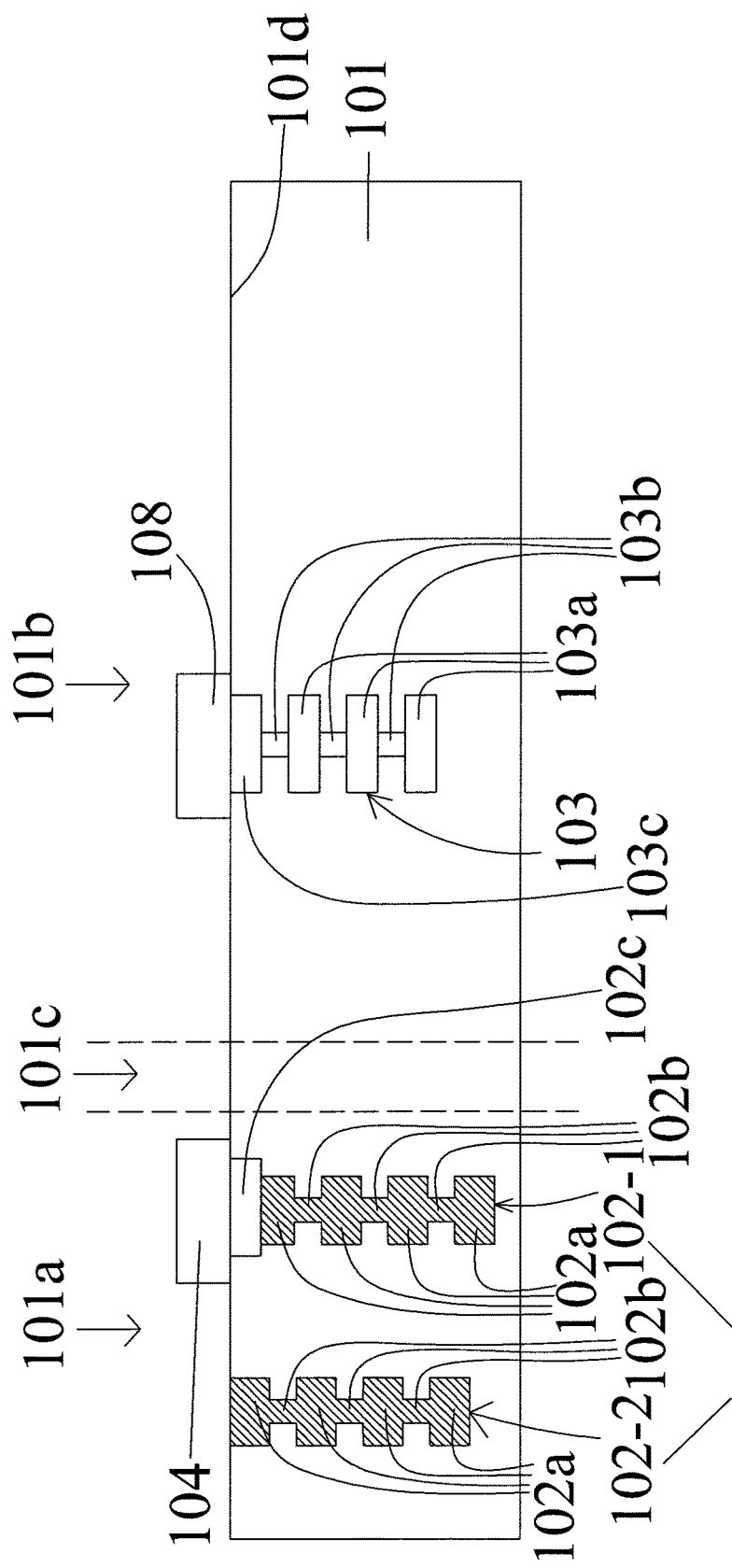
FIG. 30 is a schematic view of a substrate in accordance with some embodiments of the present disclosure.

In operation 2101, a substrate 101 is received or provided as in FIG. 30. In some embodiments, the substrate 101 is a silicon substrate. In some embodiments, the substrate 101 has similar configuration as in FIG. 1. In some embodiments, the substrate 101 is defined with a seal ring region 101a, a circuit region 101b and an assembly isolation region 101c. In some embodiments, an integrated circuit structure 103 is formed in the circuit region 101b of the substrate 101. In some embodiments, a die pad 108 is formed on the substrate 101 and disposed over the integrated circuit structure 103. In some embodiments, the die pad 108 is electrically connected with the integrated circuit structure 103 through a top metal layer 103c. In some embodiments, the integrated circuit structure 103 and the die pad 108 respectively have similar configuration as in FIG. 1.

In operation 2102, a seal ring structure 102 is formed in the seal ring region 101a as in FIG. 30. In some embodiments, the seal ring structure 102 is formed by stacking several conductive layers 102a. In some embodiments, the stacked conductive layers 102a are interconnected by several via layers 102b passing through several dielectric layers such as USG or ELK dielectric of the substrate 101. In some embodiments, the seal ring structure 102 includes a first seal ring structure 102-1 and a second seal ring structure 102-2, which have similar configuration as in FIG. 13.

Figure 30A:
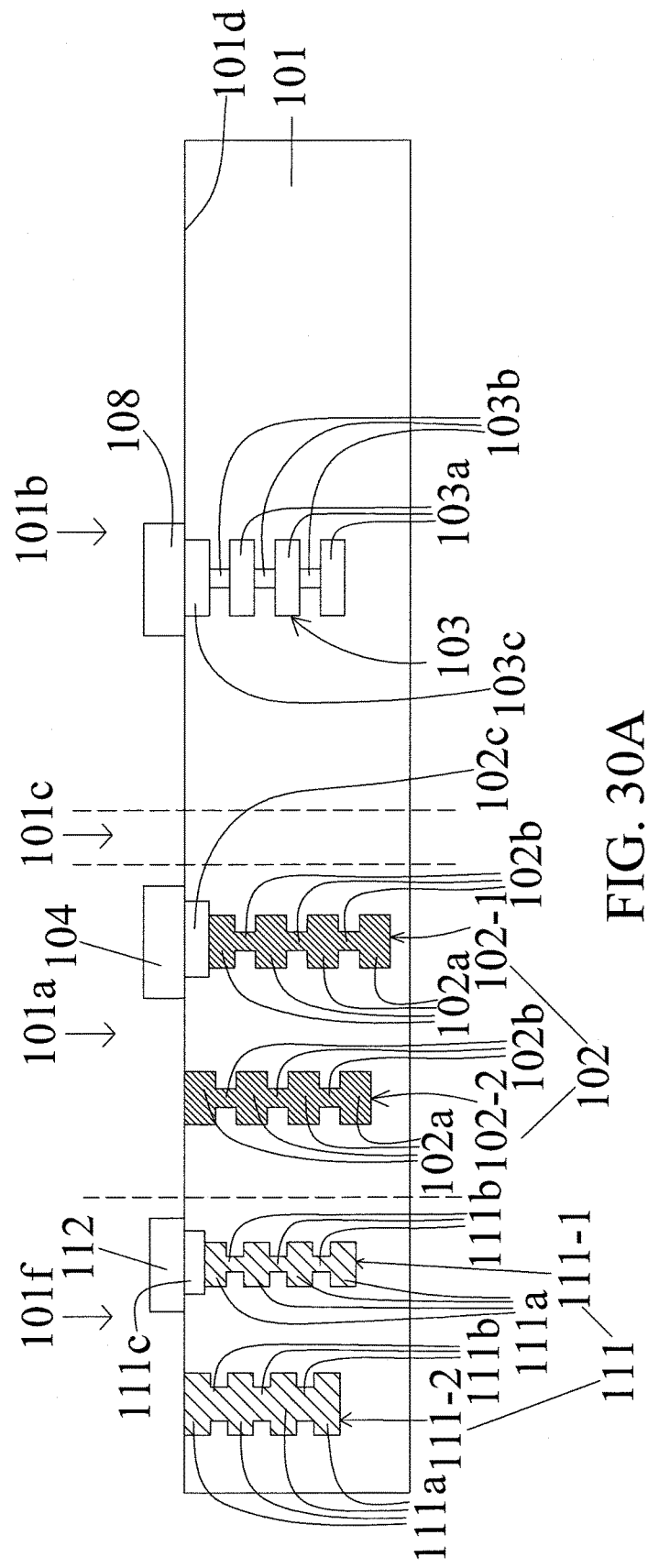
FIG. 30A is a schematic view of a substrate with a dummy bar structure in accordance with some embodiments of the present disclosure.

In some embodiments as in FIG. 30A, the substrate 101 further defines a dummy bar region 101f adjacent to the seal ring structure 101a. In some embodiments, a dummy bar structure 111 is formed in the dummy bar region 101f. In some embodiments, the dummy bar structure 111 has similar configuration as in FIG. 7. In some embodiments, the dummy bar structure 111 is formed by stacking conductive layers 111a. In some embodiments, the stacked conductive layers 111a are interconnected by several via layers 111b passing through several dielectric layers such as USG or ELK dielectric of the substrate 101. In some embodiments, the dummy bar structure 111 includes a first dummy bar structure 111-1 and a second dummy bar structure 111-2, which have similar configuration as in FIG. 18. In some embodiments, a dummy bar metal pad 112 is formed over and electrically connected with the first dummy bar structure 111-1. In some embodiments, the dummy bar metal pad 112 is electrically connected with the first dummy bar structure 111-1 through a top layer 111c.

In operation 2103, a metal pad 104 is formed and contacted with the seal ring structure 102 as in FIG. 30. In some embodiments, the metal pad 104 is disposed on the substrate 101 and electrically connected with the seal ring structure 102. In some embodiments, the metal pad 104 is disposed over the first seal ring structure 102-1. In some embodiments, the metal pad 104 is electrically connected with the first seal ring structure 102-1 through a top layer 102c.

Figure 31:
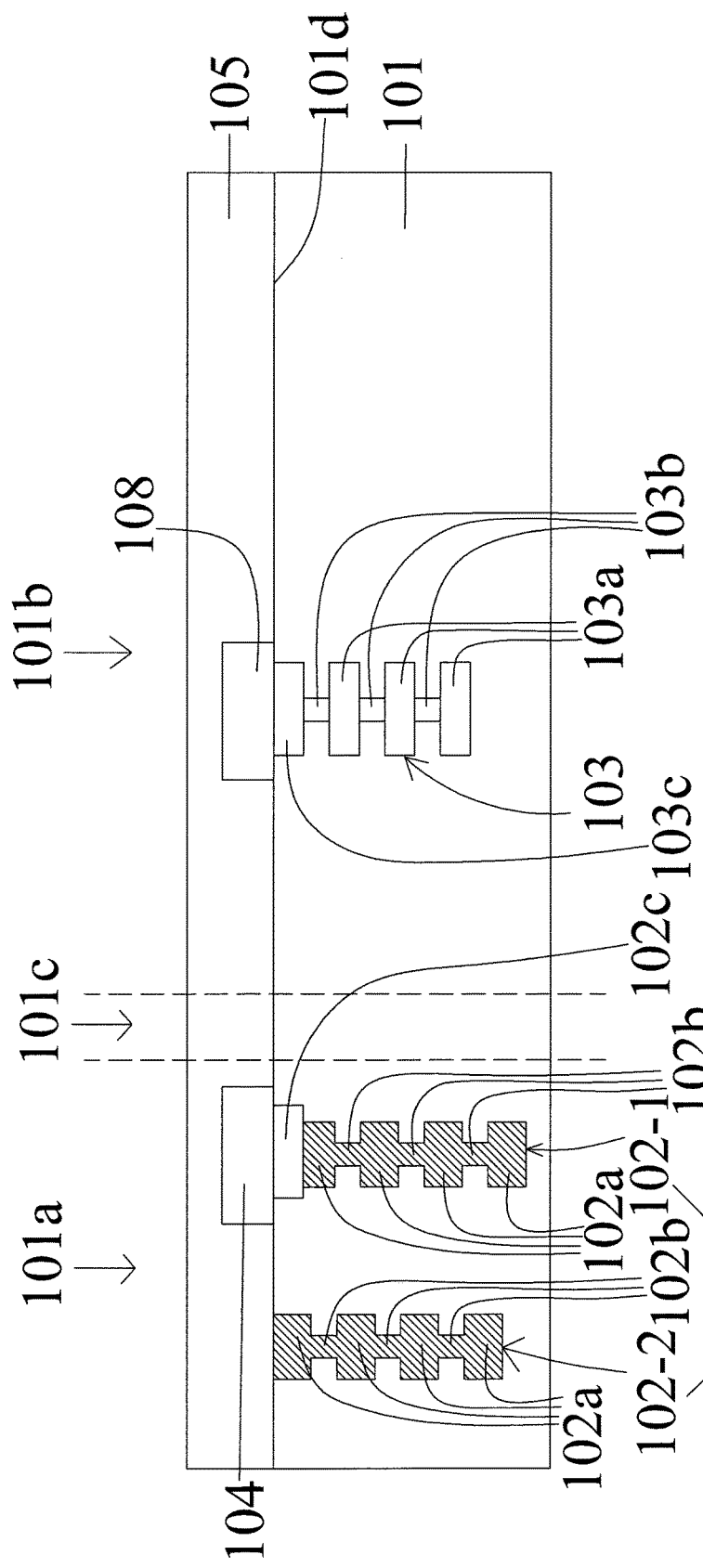
FIG. 31 is a schematic view of a passivation layer disposed on a substrate in accordance with some embodiments of the present disclosure.
Figure 31C:
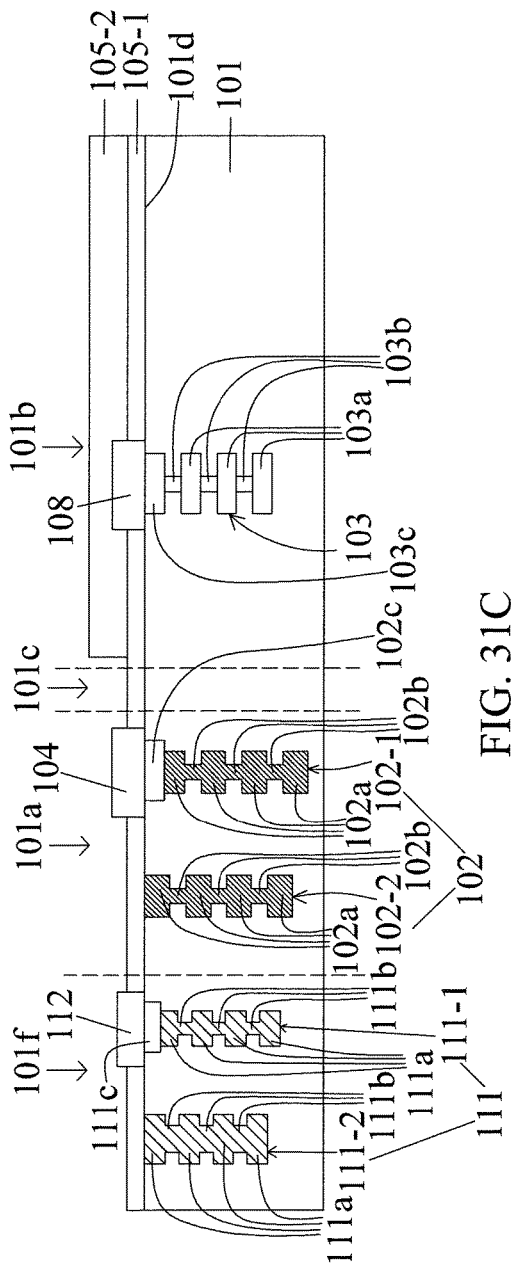
Figure 31D:
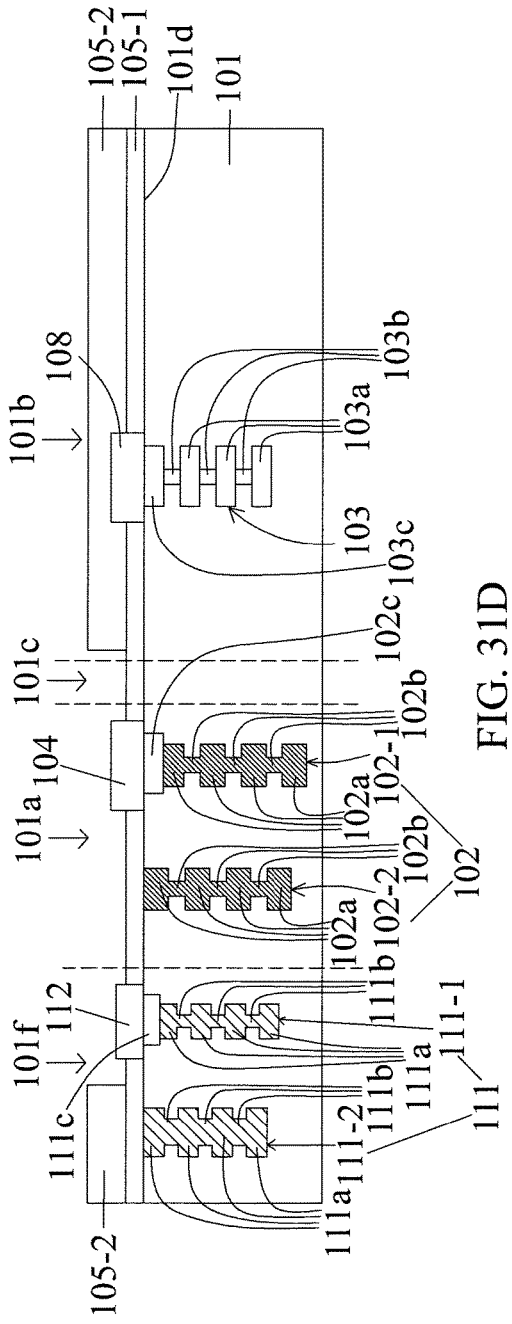

In operation 2104, a passivation layer 105 is disposed over the substrate 101 and surrounds the metal pad 104 as in FIG. 31. In some embodiments, the passivation layer 105 covers the metal pad 104 and the die pad 108. In some embodiments, the passivation layer 105 includes a first passivation layer 105-1 and the second passivation layer 105-2 as in FIGS. 31A, 31B, 31C and 31D. In some embodiments, the first passivation layer 105-1 surrounds the metal pad 104 and the die pad 108. In some embodiments, the second passivation layer 105-2 is disposed in the circuit region 101b only as in FIGS. 31A and 31C. In some embodiments, the second passivation layer 105-2 is disposed in the seal ring region 101a as in FIG. 31B or in the dummy bar region 101f as in FIG. 31D. In some embodiments, the second passivation layer 105-2 is disposed over the second seal ring structure 102-2 as in FIG. 31B or the second dummy bar structure 111-2 as in FIG. 31D.

Figure 32:
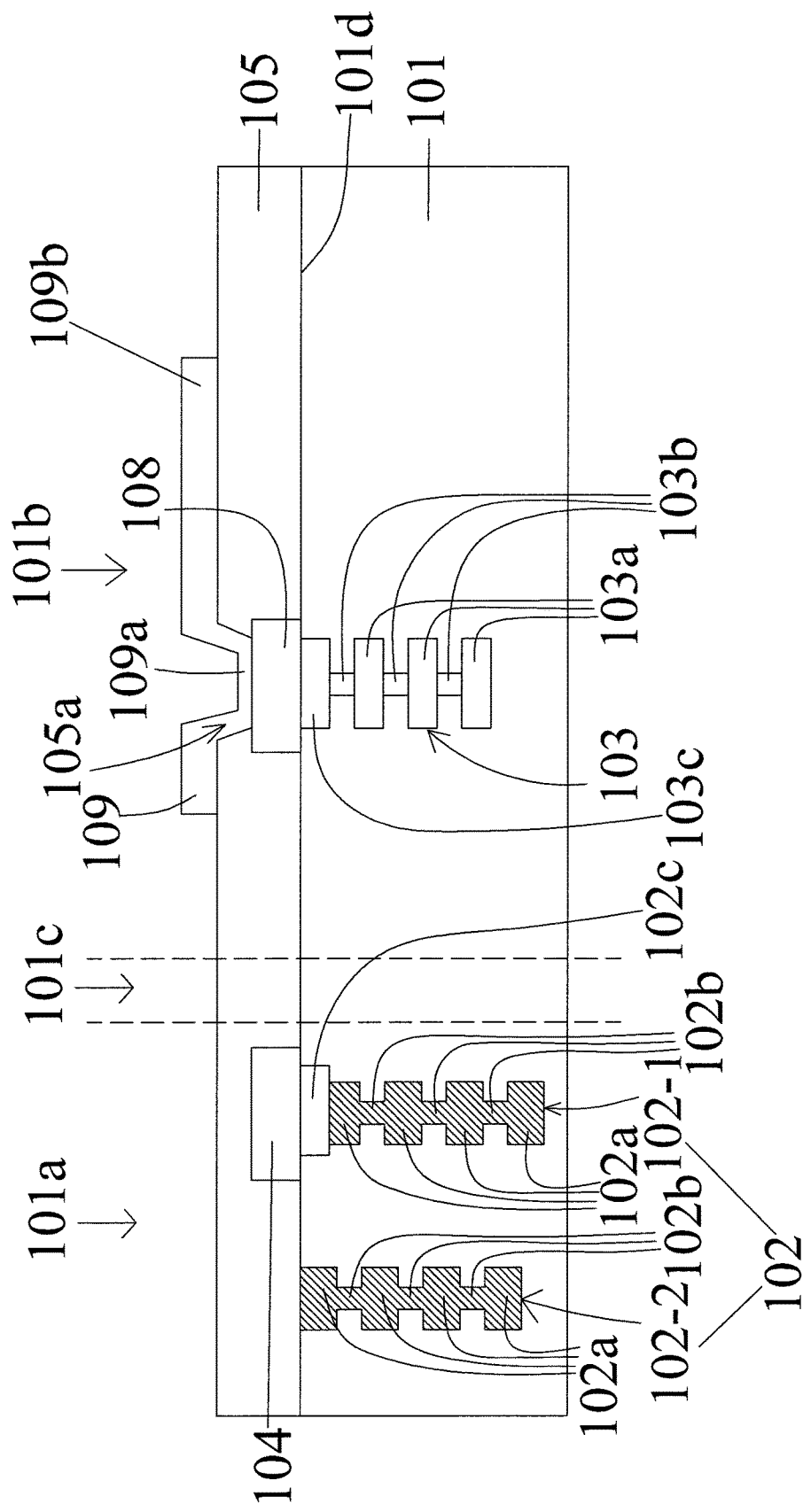
FIG. 32 is a schematic view of a post passivation interconnect (PPI) disposed on a passivation layer in accordance with some embodiments of the present disclosure.
Figure 32A:
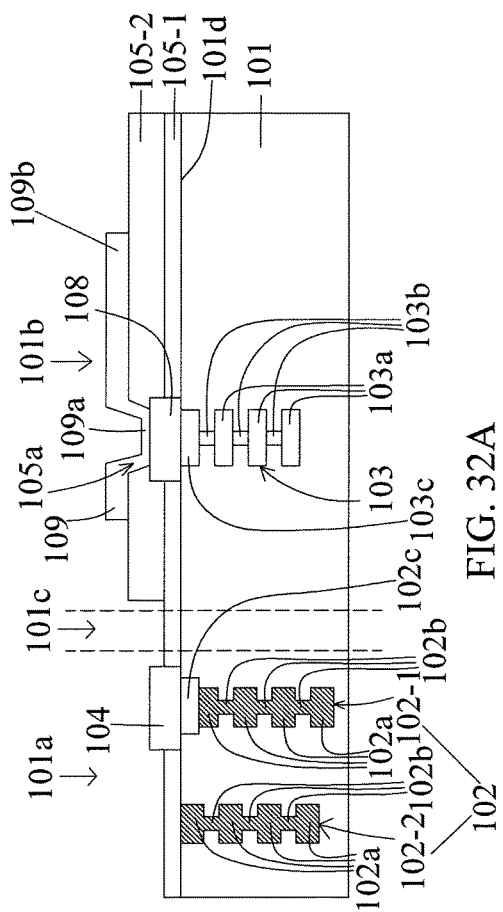
Figure 32B:
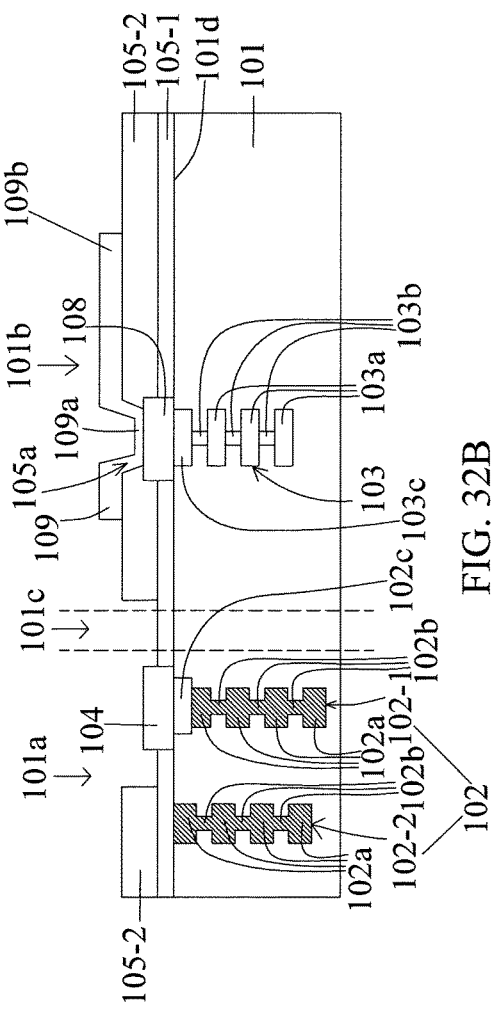

In some embodiments, a PPI 109 with similar configuration as in FIG. 1 is formed over the passivation layer 105 as in FIG. 32. In some embodiments, the PPI 109 with similar configuration as in FIG. 13 is disposed over the second passivation layer 105-2 as in FIGS. 32A, 32B, 32C and 32D.

Figure 33:
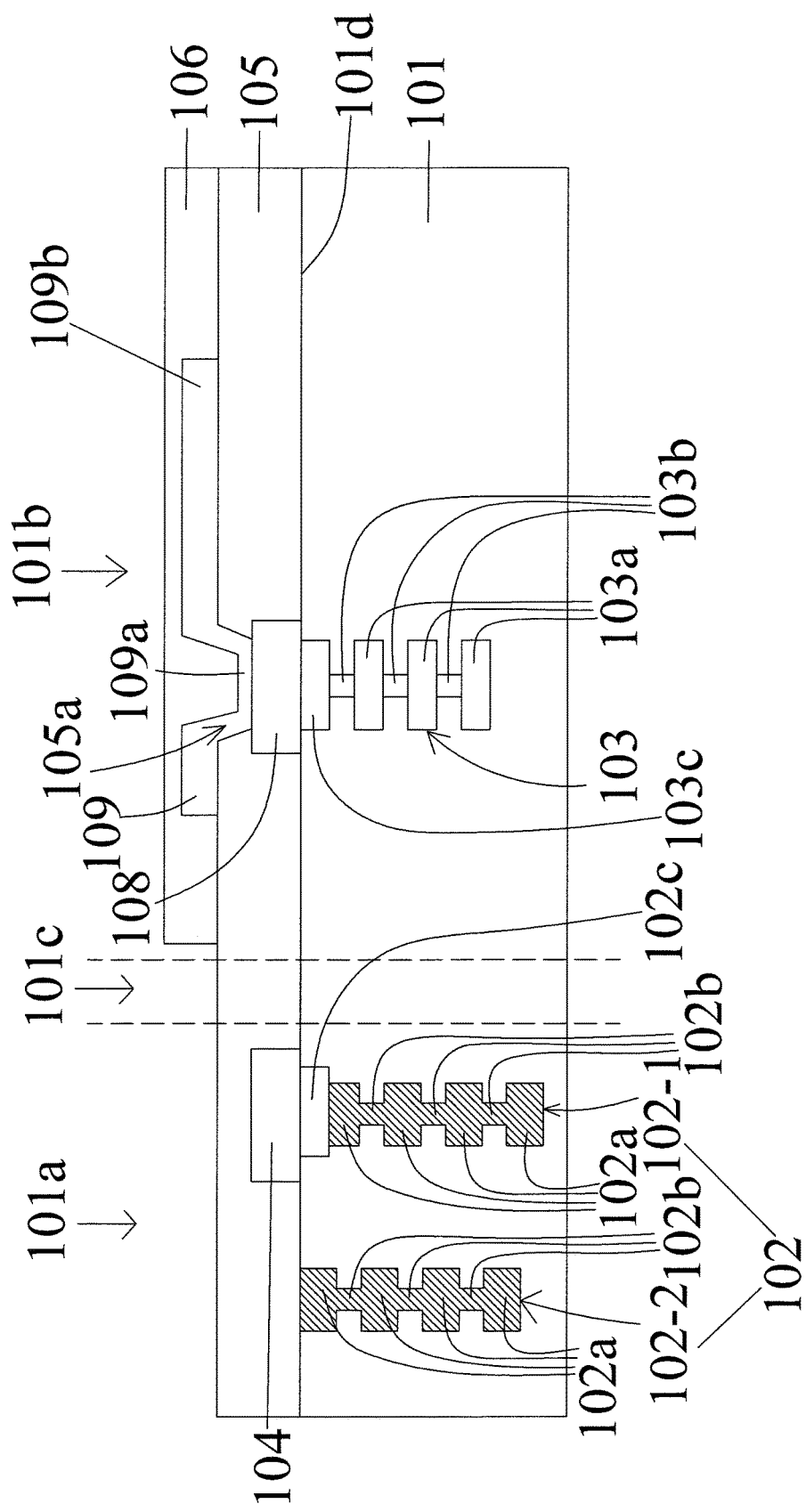
FIG. 33 is a schematic view of a polymeric layer covering a post passivation interconnect (PPI) in accordance with some embodiments of the present disclosure.

In operation 2105, a polymeric layer 106 is disposed over the passivation layer 105 and the circuit region 101b as in FIG. 33. In some embodiments, the polymeric layer 106 is disposed in the circuit region 101b and covers the PPI 109. In some embodiments, the polymeric layer 106 is disposed in the seal ring region 101a as in FIGS. 33A, 33B, 33C and 33D. In some embodiments, the polymeric layer 106 covers the first seal ring structure 102-1 only as in FIGS. 33A and 33B. In some embodiments, the first seal ring structure 102-1 and the second seal ring structure 102-2 are covered by the polymeric layer 106 as in FIGS. 33C and 33D. In some embodiments, the polymeric layer 106 is disposed in the dummy bar region 101f as in FIGS. 33C and 33D. In some embodiments, the first dummy bar structure 111-1 is covered by the polymeric layer 106.

Figure 34:
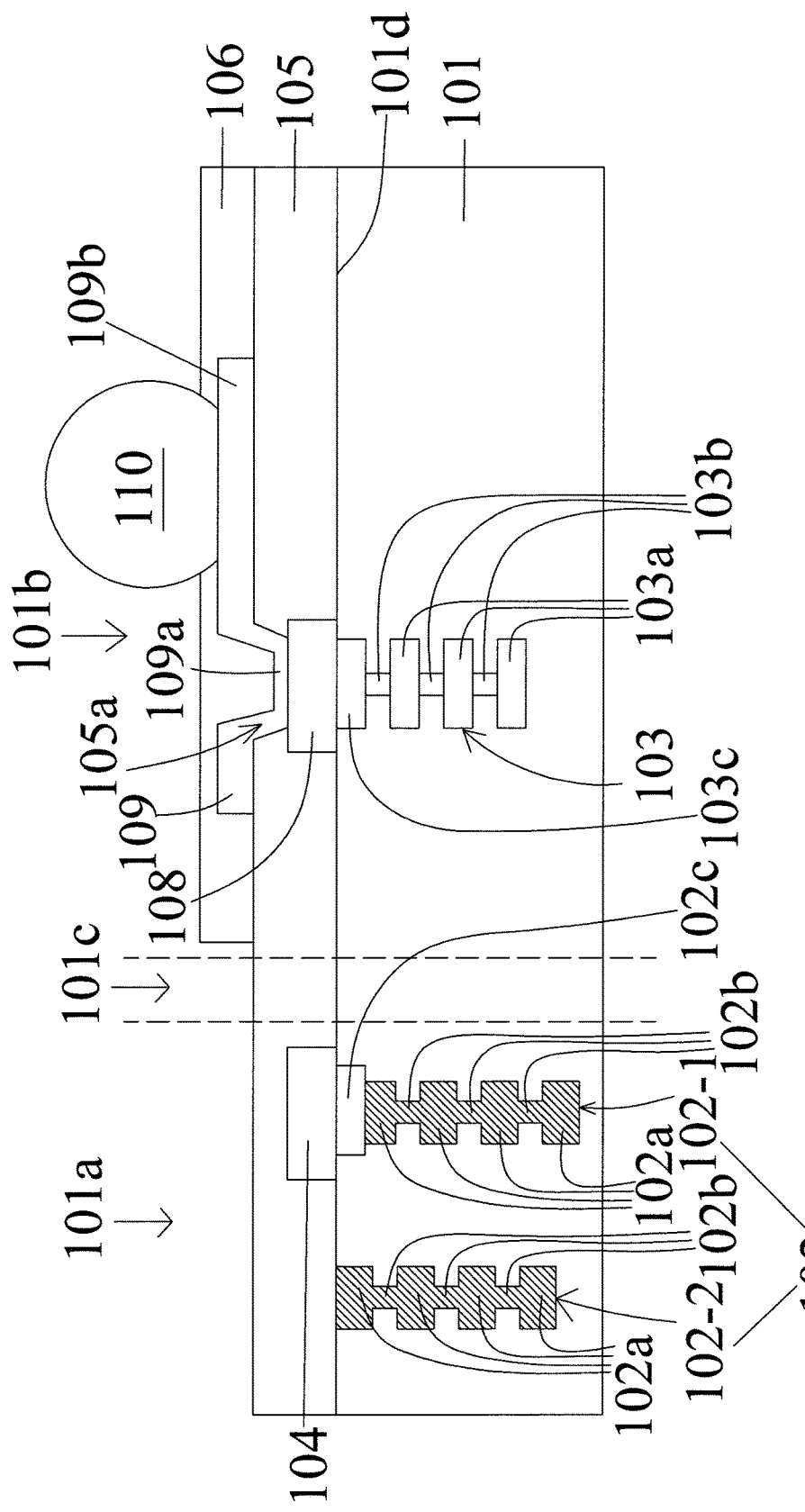
FIG. 34 is a schematic view of a conductive bump disposed over a post passivation interconnect (PPI) in accordance with some embodiments of the present disclosure.

In some embodiments, a conductive bump 110 is disposed over an elongated portion 109b of the PPI 109 and is surrounded by the polymeric layer 106 as in FIG. 34.

Figure 35:
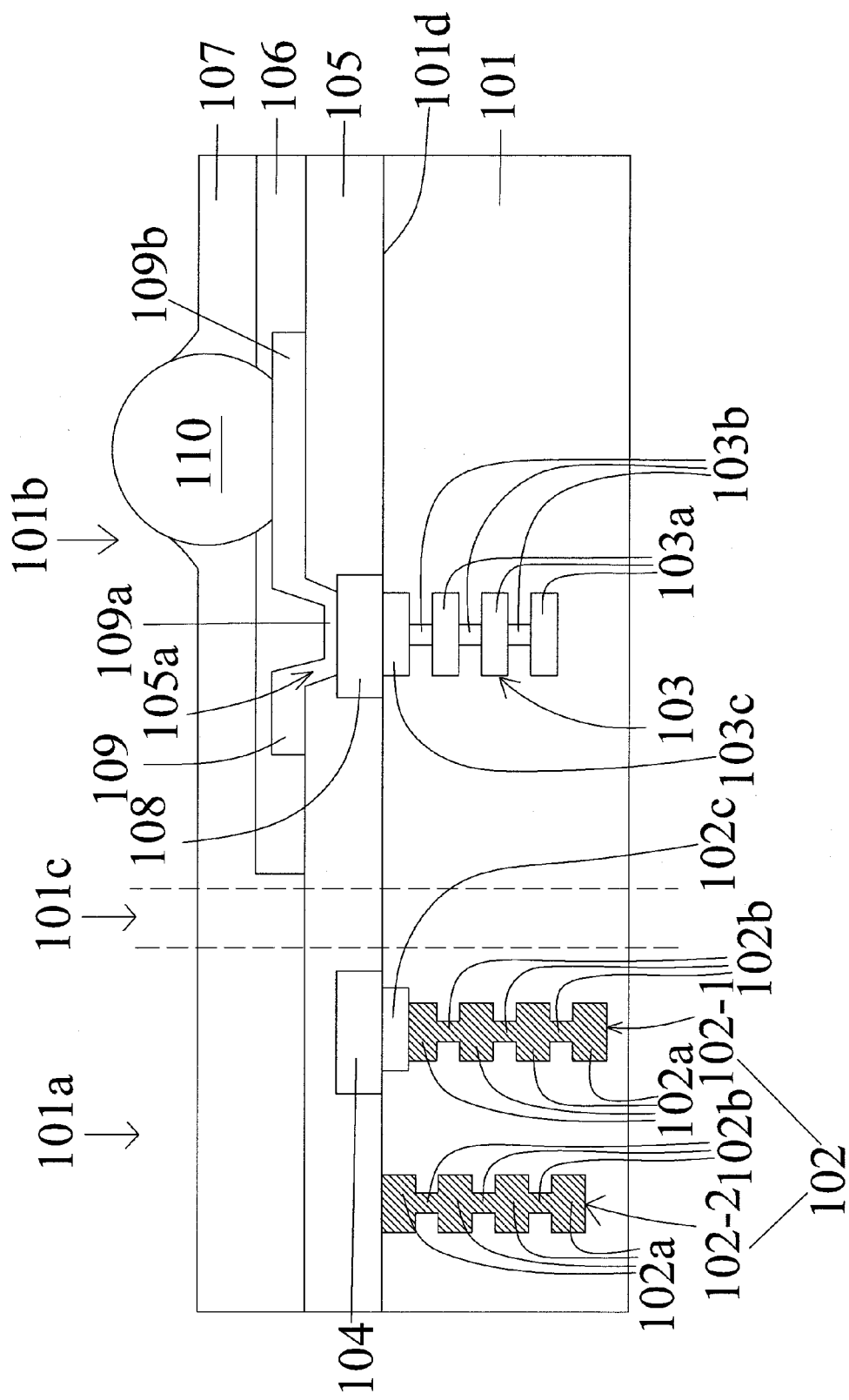
FIG. 35 is a schematic view of a molding disposed over a substrate in accordance with some embodiments of the present disclosure.

In operation 2106, a molding 107 is disposed over the polymeric layer 106 and the passivation layer 105 as in FIG. 35. In some embodiments, the molding 107 is disposed over the seal ring structure 102. In some embodiments, a semiconductor device of FIG. 35 is formed which has similar configuration as a semiconductor device 100 of FIG. 1. In some embodiments, the molding 107 covers the first seal ring structure 102-1 and the second seal ring structure 102-2 as in FIGS. 35A, 35B, 35C and 35D. In some embodiments, a semiconductor device of FIG. 35A is formed which has similar configuration as a semiconductor device 1100 of FIG. 13. In some embodiments, a semiconductor device of FIG. 35B is formed which has similar configuration as a semiconductor device 1700 of FIG. 23.

In some embodiments, the molding 107 covers the first dummy bar structure 111-1 and the second dummy bar structure 111-2 as in FIGS. 35C and 35D. In some embodiments, a semiconductor device of FIG. 35C is formed which has similar configuration as a semiconductor device 1400 of FIG. 18. In some embodiments, a semiconductor device of FIG. 35D is formed which has similar configuration as a semiconductor device 1900 of FIG. 26.

The present invention provides a semiconductor device with a structural improvement. The semiconductor device includes a molding disposed in a seal ring region or a dummy bar region to cover the seal ring structure or the dummy bar structure, such that the existing seal ring design can be applied to the semiconductor device produced in a low cost.

In some embodiments, a semiconductor device includes a substrate defined with a seal ring region and a circuit region, the substrate includes a seal ring structure and an integrated circuit structure, the seal ring structure is disposed in the seal ring region and includes a plurality of stacked conductive layers interconnected by a plurality of via layers, the integrated circuit structure is disposed in the circuit region and includes an active or a passive device, a metal pad disposed over the seal ring region and contacted with the seal ring structure, a passivation layer disposed over the substrate and covering the metal pad, a polymeric layer disposed over the passivation layer and the circuit region, and a molding disposed over the passivation layer and the polymeric layer, wherein the seal ring structure is covered by the molding.

In some embodiments, the seal ring structure is disposed underneath the molding and the passivation layer. In some embodiments, the polymeric layer is disposed over the seal ring region and covers the seal ring structure. In some embodiments, the seal ring structure further includes a top layer disposed underneath the metal pad and electrically connected with the plurality of stacked conductive layers. In some embodiments, the semiconductor device further includes a dummy bar structure disposed in a dummy bar region of the substrate neighboring the seal ring region, covered by the passivation layer and the molding, and including a plurality of stacked conductive layers interconnected by a plurality of via layers. In some embodiments, the semiconductor device further includes a dummy metal pad disposed over a dummy bar region of the substrate, contacted with a dummy bar structure neighboring the seal ring structure and covered by the passivation layer or the polymeric layer.

In some embodiments, the seal ring structure and the integrated circuit structure are surrounded by an interlayer dielectric (ILD), an inter-metal dielectric (IMD) or extreme low dielectric constant (ELK) dielectric. In some embodiments, the semiconductor device further includes a die pad disposed over the circuit region and surrounded by the passivation layer, a post passivation interconnect (PPI) routed from the die pad and surrounded by the polymeric layer, and a conductive bump disposed over an elongated portion of the PPI and surrounded by the molding. In some embodiments, the seal ring region surrounds the circuit region, or the seal ring structure surrounds the integrated circuit structure. In some embodiments, the semiconductor device further includes a dummy bar structure disposed in a dummy bar region of the substrate surrounding the seal ring region or the seal ring structure.

In some embodiments, a semiconductor device includes a substrate including an integrated circuit structure, a first seal ring structure and a second seal ring structure, a metal pad disposed over and contacted with the first seal ring structure, a first passivation layer disposed over the substrate and surrounding the metal pad, a second passivation layer disposed over the integrated circuit structure, a polymeric layer disposed over the second passivation layer, and a molding disposed over the polymeric layer and the first passivation layer, wherein the first seal ring structure and the second seal ring structure are covered by the molding.

In some embodiments, the second seal ring structure is covered by the first passivation layer, the polymeric layer and the molding. In some embodiments, the first seal ring structure or the second seal ring structure is covered by the polymeric layer. In some embodiments, the second seal ring structure is covered by the second passivation layer. In some embodiments, the substrate further includes a first dummy bar structure adjacent to the second seal ring structure and covered by the polymeric layer or the molding. In some embodiments, the substrate further includes a second dummy bar structure adjacent to a first dummy bar structure and covered by the second passivation layer or the molding.

In some embodiments, a thickness of the second passivation layer is substantially greater than a thickness of the first passivation layer.

In some embodiments, a method of manufacturing a semiconductor device includes receiving a substrate defined with a seal ring region and a circuit region, forming a seal ring structure in the seal ring region, forming a metal pad contacted with the seal ring structure, disposing a passivation layer over the substrate and surrounding the metal pad, disposing a polymeric layer over the passivation layer and the circuit region, disposing a molding over the polymeric layer and the passivation layer, wherein the molding is disposed over the seal ring structure.

In some embodiments, the disposing the polymeric layer includes disposing the polymeric layer over the seal ring region. In some embodiments, the method further includes defining a dummy bar region adjacent to the seal ring region, and forming a dummy bar structure in the dummy bar region and covered by the molding.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate defined with a seal ring region and a circuit region, wherein the substrate includes a seal ring structure and an integrated circuit structure, the seal ring structure is disposed in the seal ring region and includes a plurality of stacked conductive layers interconnected by a plurality of via layers, the integrated circuit structure is disposed in the circuit region and includes an active or a passive device;
    a metal pad disposed over the seal ring region and contacted with the seal ring structure;
    a passivation layer disposed over the substrate and covering on the metal pad;
    a polymeric layer disposed over the passivation layer and the circuit region; and
    a conductive bump disposed over the circuit region of the substrate;
    a molding disposed over the passivation layer and the polymeric layer, wherein the molding and the polymeric layer surround and are in contact with the conductive bump,
    wherein the seal ring structure is covered by the molding.

2. The semiconductor device of claim 1, wherein the seal ring structure is disposed underneath the molding and the passivation layer.

3. The semiconductor device of claim 1, wherein the polymeric layer is disposed over the seal ring region and covers the seal ring structure.

4. The semiconductor device of claim 1, wherein the seal ring structure further includes a top layer disposed underneath the metal pad and electrically connected with the plurality of stacked conductive layers.

5. The semiconductor device of claim 1, further comprising a dummy bar structure disposed in a dummy bar region of the substrate neighboring the seal ring region, covered by the passivation layer and the molding, and including a plurality of stacked conductive layers interconnected by a plurality of via layers.

6. The semiconductor device of claim 1, wherein further comprising a dummy metal pad disposed over a dummy bar region of the substrate, contacted with a dummy bar structure neighboring the seal ring structure and covered by the passivation layer or the polymeric layer.

7. The semiconductor device of claim 1, wherein the seal ring structure and the integrated circuit structure are surrounded by an interlayer dielectric (ILD), an inter-metal dielectric (IMD) or extreme low dielectric constant (ELK) dielectric.

8. The semiconductor device of claim 1, further comprising a die pad disposed over the circuit region and surrounded by the passivation layer, a post passivation interconnect (PPI) routed from the die pad and surrounded by the polymeric layer, and the conductive bump disposed over an elongated portion of the PPI and surrounded by the molding.

9. The semiconductor device of claim 1, wherein the seal ring region surrounds the circuit region, or the seal ring structure surrounds the integrated circuit structure.

10. The semiconductor device of claim 1, further comprising a dummy bar structure disposed in a dummy bar region of the substrate surrounding the seal ring region or the seal ring structure.

11. A semiconductor device, comprising:
a substrate including an integrated circuit structure, a first seal ring structure and a second seal ring structure;
a metal pad disposed over and contacted with the first seal ring structure;
a first passivation layer disposed over the substrate and surrounding the metal pad;
a second passivation layer disposed over the integrated circuit structure;
a polymeric layer disposed over the second passivation layer; and
a molding disposed over the polymeric layer and the first passivation layer,
wherein the first seal ring structure is disposed between the integrated circuit structure and the second seal ring structure, the first seal ring structure and the second seal ring structure are covered by the molding, and the integrated circuit structure is enclosed by the first seal ring structure and the second seal ring structure.

12. The semiconductor device of claim 11, wherein the second seal ring structure is covered by the first passivation layer, the polymeric layer and the molding.

13. The semiconductor device of claim 11, wherein the first seal ring structure or the second seal ring structure is covered by the polymeric layer.

14. The semiconductor device of claim 11, wherein the second seal ring structure is covered by the second passivation layer.

15. The semiconductor device of claim 11, wherein the substrate further includes a first dummy bar structure adjacent to the second seal ring structure and covered by the polymeric layer or the molding.

16. The semiconductor device of claim 11, wherein the substrate further includes a second dummy bar structure adjacent to a first dummy bar structure and covered by the second passivation layer or the molding.

17. The semiconductor device of claim 11, wherein a thickness of the second passivation layer is substantially greater than a thickness of the first passivation layer.

18. A semiconductor device, comprising:
a substrate defined with a seal ring region and a circuit region, the substrate includes a seal ring structure and an integrated circuit structure, the seal ring structure is disposed in the seal ring region and includes a plurality of stacked conductive layers interconnected by a plurality of via layers, the integrated circuit structure is disposed in the circuit region and includes an active or a passive device;
a passivation layer disposed over the seal ring structure and the integrated circuit structure;
a polymeric layer disposed over the passivation layer and the circuit region;
a post passivation interconnect (PPI) disposed over the circuit region of the substrate;
a conductive bump directly disposed on the PPI; and
a molding disposed over the PPI, the passivation layer and the polymeric layer, wherein the molding is disposed over the seal ring region and the circuit region, and the polymeric layer surrounds and is in contact with the conductive bump.

19. The semiconductor device of claim 18, wherein the plurality of stacked conductive layers are stacked vertically along a thickness of the substrate.

20. The semiconductor device of claim 18, wherein the molding partially encapsulates the conductive bump disposed in the circuit region.

* * * * *